United States Patent [19]
Hamakawa et al.

[11] Patent Number: 5,686,734
[45] Date of Patent: Nov. 11, 1997

[54] THIN FILM SEMICONDUCTOR DEVICE AND PHOTOELECTRIC CONVERSION DEVICE USING THE THIN FILM SEMICONDUCTOR DEVICE

[75] Inventors: Yoshihiro Hamakawa, Kawanishi; Shigetoshi Sugawa, Atsugi; Tadashi Atoji, Machida; Hiroaki Okamoto, Kawanishi, all of Japan

[73] Assignee: Canon Kabushiki Kaisha, Tokyo, Japan

[21] Appl. No.: 502,603

[22] Filed: Jul. 14, 1995

Related U.S. Application Data

[63] Continuation of Ser. No. 183,970, Jan. 21, 1994, abandoned.

[30] Foreign Application Priority Data

Jan. 22, 1993 [JP] Japan .................................. 5-009337
Dec. 2, 1993 [JP] Japan .................................. 5-302887

[51] Int. Cl.$^6$ .................................................... H01L 29/12
[52] U.S. Cl. ...................... 257/16; 257/19; 257/21; 257/22; 257/55; 257/63; 257/65; 257/77; 257/613
[58] Field of Search ................................ 257/16, 19, 21, 257/22, 55, 63, 65, 72, 77, 613

[56] References Cited

U.S. PATENT DOCUMENTS

| | | | |
|---|---|---|---|
| 4,109,271 | 8/1978 | Pankove | 257/53 |
| 4,329,699 | 5/1982 | Ishihama et al. | 257/55 |
| 4,383,269 | 5/1983 | Capasso | 357/30 |
| 4,452,875 | 6/1984 | Ogawa et al. | 257/55 |
| 4,784,702 | 11/1988 | Henri | 257/53 |
| 5,260,560 | 11/1993 | Yamanabe et al. | 257/186 |

FOREIGN PATENT DOCUMENTS 63-278269  11/1988  Japan .............................. H01L 27/14

OTHER PUBLICATIONS

Hayashi, et al. "Determination of Band Discontinuity in Amorphous Silicon Heterojunctions", *Jap. J. Appl. Physics*, 27, 1988, L314–L316.

Tawada, et al "Properties and structure of a-SiC:H for high-efficiency solar cell", *J. Appl Phys.* 53 (7), 1982, 5273–5281.

Paasche, et al. "Amorphous–SiC Thin–Film p–i–n Light–Emitting Diode Using Amorphous–SiN Hot–Carrier Tunneling Injection Layers," *IEEE Transactions on Electronic Devices*, 36, 1989, 2895–2902.

Tsukude, et al. "Amorphous Silicon Superlattice Thin Film Transistors," *Jap. J. Appl. Physics*, 26, 1987, L111–L113.

Morisaki et al., "Formation of Nickel Oxyhydride Thin Fibres by Electro–deposition and Their Electrochromic Characteristics," JJAP, 27:314 (1988).

Williams et al., "The Graded Bandgap Multilayer Avalanche Photodiode: A New Low–Noise Detector," *IEEE Electron Device Letters*, EDL-3:71 (1982).

Mimura et al., "Energy–band Discontinuities in a Heterojunction of Amorphous Hydrogenated Si and Crystalline Si Measured by Internal Photoemission," *Appl. Phys. Lett.*, 59:326 (1987).

*Primary Examiner*—J. Carroll
*Attorney, Agent, or Firm*—Fitzpatrick, Cella, Harper & Scinto

[57] ABSTRACT

A high performance thin film semiconductor device having a heterojunction such as a photoelectric conversion device is disclosed. In accordance with the present invention, the thin film semiconductor device comprises a thin semiconductor layer which forms a heterojunction with a non-single crystal silicon layer or non-single crystal silicon-germanium layer, wherein the valence band discontinuity at the heterointerface arising from the difference in optical energy bandgap is as small as 0.3 eV or less and wherein the thin semiconductor layer has an optical energy bandgap greater than 2.8 eV, so that hole transport performance may not be degraded. Such a thin semiconductor layer may be formed by using silane gas and methane gas with a flow rate ratio greater than 30 at a deposition rate less than 0.5 Å/sec.

24 Claims, 19 Drawing Sheets

SAMPLE FOR IPE MEASUREMENT

SAMPLE FOR XPE MEASUREMENT 61 a-$Si_{1-a}N_a$:H LAYER (20Å)
a-$Si_{1-x}C_x$:H LAYER (20Å)

63 i-TYPE a-Si:H LAYER (5000Å)

64 QUARTZ SUBSTRATE

PRIOR ART

PRIOR ART

PRIOR ART

THIN FILM SEMICONDUCTOR DEVICE AND PHOTOELECTRIC CONVERSION DEVICE USING THE THIN FILM SEMICONDUCTOR DEVICE

This application is a continuation of application Ser. No. 08/183,970 filed Jan. 21, 1994, which is now abandoned.

BACKGROUND OF THE INVENTION

1. Field of the Invention

The present invention relates to a thin film semiconductor device, for example, a photoelectric conversion device such as a photosensor and a solar cell, a thin film transistor, and a thin film light emitting device, wherein said thin film semiconductor comprises a heterojunction consisting of materials with different optical energy bandgaps. The present invention also relates to an information processing device using such a device, and to a method of fabricating thin semiconductor layers used in these devices described above.

2. Description of the Related Art

In a non-single crystal semiconductor material such as amorphous silicon (hereafter referred to as a-Si:H), if Ge or Sn atoms or the like are doped, then the optical energy bandgap of a material becomes narrower. In contrast, if H, C, or N atoms are doped, the optical energy bandgap will be widened. Due to this fact, non-single crystal semiconductor materials have an advantage over single crystal semiconductor or single crystal compound semiconductor materials in that a material having a desired optical energy bandgap can be readily obtained.

Various types of photoelectric conversion devices and thin film semiconductor devices have been proposed which use a multi-layer heterojunction structure made up of materials with different optical energy bandgaps having advantageous properties described above.

One of such devices is a solar cell with a multi-layer structure composed of a plurality of films having different optical energy bandgaps which can effectively absorb a wide range of wave lengths of light, from short to long wave lengths. Such a solar cell can utilize the entire spectrum of sunlight including a wide range of wave lengths.

Another proposed device is a thin film transistor or photosensor whose response performance or high frequency characteristics are improved by enhancing carrier mobilities with a super-lattice structure comprising multilayered semiconductor films each of which has a thickness of an order of a few Angstroms.

In a thin film light emitting device, it has been tried to use a mulitilayerd structure with a quantum well which confines carriers in it so as to improve light emitting efficiency.

In a photoelectric conversion device such as a photosensor, it is required to have a high signal-to-noise ratio in its photoelectric conversion operation. Of various types of photoelectric conversion devices, an APD-type photoelectric conversion device having an avalanche photodiode (APD) in a light receiving portion, which operates by means of avalanche effects, is expected to be a promising device which can meet the above-described requirement, and a lot of efforts have been made on its development in recent years.

However, in a commonly known APD, it is required to apply a high electric field to it to obtain avalanche effects. This causes degradation in the signal-to-noise ratio due to excess multiplication noise which occurs because of fluctuation in the multiplication process.

To conquer this problem, F. Capasso et al., for example, proposed a low noise APD composed mainly of Group III-V single-crystal compound semiconductor materials grown by means of molecular beam epitaxy (MBE), which is applicable to optical fiber communication systems (U.S. Pat. No. 4,383,269, Japanese Patent Application Laid-Open No. 58-157179, IEEE Electron Device Letters, pp.71–73, Vol.EDL-3,1982).

FIG. 1 is a schematic diagram showing an example of the APD proposed by Capasso et al.

FIG. 1 shows schematically a cross section of the APD, and FIG. 2a shows the energy band structure of the APD shown in FIG. 1. The APD shown in these figures has four layers of i-type bandgap-grading semiconductor, 401,403, 405, and 407 for use as multiplication layers, which are disposed between a p-type semiconductor layer 411 and an n-type semiconductor layer 415. An electrode 413 is in ohmic contact with the p-type semiconductor layer 411, and an electrode 414 is in ohmic contact with the n-type semiconductor layer 415.

FIG. 2b shows an energy band structure of the APD in an operating state where a large electric field is applied. As can be seen from FIG. 2b, enhancement in ionization occurs due to the abrupt discontinuity in bandgap at heterointerfaces 402, 404, and 406 at which abrupt stepping back of the energy bandgap occurs. As a result, multiplication of carriers due to the ionization occurs preferentially in the regions near the stepping-back heterointerfaces.

The structure discussed above leads to less fluctuation in locations where ionization occurs, and thus leads to less fluctuation in multiplication process. As a result, it is possible to achieve an APD having lower excess noise and an improved signal-to-noise ratio, which is applicable to an optical fiber communication system.

A conventional APD is a useful discrete device when it is operated under a high electric field condition and when it is used for an optical fiber communication system as discussed above. However, an APD has the disadvantages that materials used in it, such as Group III-V or Group II-VI compound semiconductors, are toxic and these materials result in high costs. Moreover, an ultra-high vacuum system is required to grow a single crystal compound semiconductor which is a component material of the APD, and the growth must be carried out at a high temperature (higher than about 500° C.), which makes it difficult to apply an APD to a large-area photoelectric conversion device, and which also makes it impossible to form an APD on a semiconductor substrate on which a signal processing circuit or the like has been already formed. Thus, conventional APDs have limitations in their application.

In contrast, non-single crystal semiconductor such as amorphous silicon can be formed easily at a low temperature by using common techniques such as plasma-assisted-CVD. Therefore, non-single crystal semiconductor can be easily formed on a large variety of substrates including such a semiconductor substrate on which signal processing circuits have been already formed. From these points of view, there is a requirement to realize a high performance APD made up of non-single crystal semiconductor materials.

In order to realize a low noise APD, it is needed to increase ionization ratio in regions near stepping-back interfaces of heterojunctions where carrier multiplication occurs. To this end, it is required to form a large discontinuity only either in the valence band or in the conduction band at stepping-back regions by using materials having different optical energy bandgaps.

To induce avalanche multiplication near the stepping-back heterointerface regions, a material used for a maximum energy bandgap portion should have a sufficiently large energy bandgap. However even if a-$Si_{1-y}Ge_y$:H is used as a material to form a minimum energy bandgap portion, achievable minimum energy bandgap of the material having good photoelectric characteristics is about 1.4 eV. To achieve a heterojunction between the a-$Si_{1-y}Ge_y$:H and a different material, which has a sufficiently large amount of discontinuity in the energy bandgap to induce avalanche multiplication, the other material must have an energy bandgap at least twice that of a-$Si_{1-y}Ge_y$:H or 2.8 eV. If a-Si:H is used instead of a-$Si_{1-y}Ge_y$:H, a material with good characteristics has an optical energy bandgap of about 1.7 eV, and thus the other material to be incorporated should have an energy bandgap larger than 3.4 eV.

While detailed investigation has not been carried out yet on discontinuity in valence or conduction bands of non-crystal semiconductor materials such as a-$Si_{1-y}Ge_y$:H, T. Hayashi et al. have reported that a silicon nitride layer (a-$SiN_x$:H) formed by plasma-assisted-CVD has a large energy bandgap up to 5.0 eV and it provides widening in the energy bandgap on both sides of a conduction band and valence band (Jpn. J. Appl. Phys. 27, 1988, pp. L314–L316).

On the other hand, in the case of silicon carbide (a-$Si_{1-x}C_x$:H) formed by plasma-assisted-CVD, discontinuity in optical energy bandgap occurs almost only in the conduction band when the optical energy bandgap is in a low range (about 2.5 eV), and thus there are no adverse effects on transport of minority carriers, which can be seen, for example, from the fact that this material can be used as a window material in a solar cell.

However, carbon-based source gas such as $CH_4$ or $C_2H_4$ has a lower deposition efficiency of plasma-assisted-CVD than $SiH_4$, which means that carbon atoms are not easily incorporated within a resultant film. Thus, in a practically available film having characteristics good enough for use in semiconductor devices, it is difficult to expand the optical energy bandgap beyond 2.8 eV. Furthermore, because conductivity of a-$Si_{1-x}C_x$:H becomes drastically low when its optical energy bandgap becomes larger than 2.5 eV, the optical energy bandgap of an a-$Si_{1-x}C_x$:H layer which can be used in a solar cell or in a photoelectric conversion device (in most solar cells, a-$Si_{1-x}C_x$:H is used as a window layer) is less than 2.2 eV. Even in such a layer, there may exist recombination levels at an interface between the layer and a-Si:H, and thus it is often required to provide a graded layer acting as a buffer interface layer having a gradient in optical energy bandgap.

In a thin film semiconductor device in which carriers travel in an electric field along an interface of a heterojunction comprising materials having different optical energy bandgaps, if there is a large discontinuity due to the difference in optical energy bandgap, carrier transport performance is degraded by traps or recombination at the interface. Especially in amorphous silicon or the like, if there is a large valence band discontinuity, inherent low carrier mobility of holes further becomes very low.

It is an object of the present invention to overcome the problems described above, more specifically, to provide a thin film semiconductor device including non-single crystal silicon carbide ($Si_{1-x}C_x$:H) used as a wide optical energy bandgap semiconductor material which forms optical energy band structure having very small valence band discontinuity at a heterointerface with an a-Si:H or a-$Si_{1-x}Ge_x$:H, and to provide a method of producing a thin semiconductor layer for use in the above-described semiconductor device.

It is another object of the present invention to provide a method of producing a semiconductor layer which does not show degradation in hole mobility at a heterointerface, and also to provide a thin film semiconductor device with the above-described semiconductor layer, and an information processing device having this kind of semiconductor device.

It is a further object of the present invention to provide a thin film semiconductor device having a large fill factor (FF) and thus having an improved conversion efficiency when it is used as a solar cell, and also to provide an information processing device with the above-described semiconductor device, and further to provide a method of producing a semiconductor for use in such a device.

It is another object of the present invention to provide a semiconductor device exhibiting excellent response and frequency characteristics when used as a thin film semiconductor device or as a photosensor, and also to provide an information processing device with the above-described semiconductor device, and further to provide a method of producing a semiconductor for use in such a device. It is still another object of the present invention to provide a thin film semiconductor device exhibiting excellent light emitting characteristics when used as a light emitting device such as an EL or a LED, and also to provide an information processing device with the above-described semiconductor device, and further to provide a method of producing a semiconductor for use in such a device.

It is a further object of the present invention to provide a low temperature production method of a semiconductor, which can be used to form a semiconductor layer on a large size of semiconductor substrate on which other devices or circuits such as a signal processing circuit have been already formed.

It is a still further object of the present invention to provide a thin film semiconductor device which exhibits low excess noise and low dark current noise and which can perform high efficiency multiplication operation when used as an avalanche photodiode, and also to provide an information processing device with the above-described semiconductor device, and further to provide a method of producing a semiconductor for use in such a device.

It is another object of the present invention to provide a thin film semiconductor device which shows neither spikes nor notches even during accumulation operation, and also to provide an information processing device with the above-described semiconductor device, and further to provide a method of producing a semiconductor for use in such a device.

It is another object of the present invention to provide a thin film semiconductor device with a heterojunction such as a photoelectric conversion device which has drastically improved characteristics.

It is another object of the present invention to provide a semiconductor device comprising a semiconductor having an optical energy bandgap larger than 2.8 eV which forms at least one heterojunction with a non-single crystal silicon film or non-single crystal silicon-germanium film wherein the amount of valence band discontinuity at the heterointerface is less than 0.3 eV.

It is another object of the present invention to provide a method of producing a semiconductor device comprising a semiconductor having an optical energy bandgap larger than 2.8 eV which forms at least one heterojunction with a non-single crystal silicon film or a non-single crystal silicon-germanium film wherein the amount of valence band discontinuity at the heterointerface is less than 0.3 eV, in which the semiconductor is formed by means of plasma-assisted CVD using source gas comprising a mixture of $CH_4$ and silane compound gas wherein the source gas is supplied in such a manner that the ratio of the flow rate of $CH_4$ gas to that of silane compound gas is larger than 30, and wherein said semiconductor is grown at a rate less than 0.5 Å/sec.

SUMMARY OF THE INVENTION

To achieve the objects described above, in one aspect of the present invention, there is provided an amorphous silicon carbide semiconductor having an optical energy bandgap larger than 2.8 eV, which can form a heterojunction with a non-single crystal silicon film or non-single crystal silicon-germanium film wherein the valence band discontinuity due to the difference in optical energy bandgap is less than 0.3 eV.

In another aspect of the present invention, a semiconductor is produced by a method using plasma-assisted CVD with source gas comprising a mixture of $CH_4$ and silane compound gas wherein the source gas is supplied in such a manner that the ratio of the flow rate of $CH_4$ gas to that of silane compound gas is larger than 30, and wherein said semiconductor is grown at a rate less than 0.5 Å/sec.

In an amorphous silicon carbide layer in accordance with the present invention, it will be more preferable to form $Si_{1-x}C_x$:H such that the composition ratio of carbon atoms to silicon atoms is larger than 0.45 and such that the amount of hydrogen atoms bonded to silicon atoms in the layer is five or more times larger than that of the hydrogen atoms bonded to carbon atoms.

In the present invention, the term "non-single" crystal is used to describe a crystal such as an "amorphous" crystal, a "micro"-crystal, and a mixture of these, although an amorphous crystal may be the most preferable.

That is, a non-single crystal silicon film includes amorphous silicon and/or micro-crystal silicon, and a non-single crystal silicon-germanium film includes amorphous silicon-germanium and/or micro-crystal silicon-germanium film. Similarly, a non-single crystal silicon carbide film includes amorphous silicon carbide and/or micro-crystal silicon carbide. Of these, amorphous ones are the most preferable.

Valence band discontinuity as measured at room temperature is preferably less than 0.3 eV and more preferably less than 0.1 eV so that hole transport performance is not degraded. The present invention can provide a producing method which is optimized to obtain small ΔEv such as 0.2 eV or less for an a-$Si_{1-x}C_x$:H having the maximum optical energy bandgap of 3.6 eV forming a heterojunction with an a-$Si_{1-y}Ge_y$:H or a-Si:H.

According to the features of the present invention described above, or as will be described in more detail below, there occurs no degradation in hole mobility at a heterojunction of a heterojunction thin film device such as a photoelectric conversion device, in contrast to a conventional device of this type which has suffered from the degradation in hole mobility. Thus, the present invention can provide a thin film semiconductor device having good performance, in which the problems described above have been solved, and thus the objects described above have been achieved.

BRIEF DESCRIPTION OF THE DRAWINGS

FIG. 2 is a schematic illustrating an energy band structure of the APD-type photoelectric conversion device shown in FIG. 1, wherein

FIG. 18 is a schematic representation of energy bands of the photoelectric conversion device shown in FIG. 17, wherein

FIG. 19 is a schematic diagram illustrating a photoelectric conversion device for use in an information processing device in accordance with the present invention, wherein

DESCRIPTION OF THE PREFERRED EMBODIMENTS

An embodiment of the invention will now be described below with reference to the accompanying drawings.

First, before the description of the embodiment of the present invention, what leads to a wide optical energy bandgap of a non-single crystal silicon carbide film ($Si_{1-x}C_x$:H) used in a thin film semiconductor device according to the present invention will be described.

In addition to a $Si_{1-x}C_x$:H film in accordance with the present invention, an a-Si:H film as well as a common plasma-assisted-CVD silicon nitride film ($SiN_x$:H) having a wide optical energy bandgap was produced for comparison.

All of these films were produced by using the same plasma-assisted CVD system. The a-Si:H film was grown at a substrate temperature of 200° C., with the flow rates of source gas $SiH_4/H_2$=10 sccm/90 sccm, at a depositon gas pressure of 0.5 Torr, and at an RF power of 10 W. The $SiN_x$:H film was grown at a substrate temperature of 350° C., with the flow rates of source gas $SiH_4/NH_3/H_2$=5 sccm/100 sccm/100 sccm, at a depositon gas pressure of 0.2 Torr, and at an RF power of 20 W. The $Si_{1-x}C_x$:H film was grown at a substrate temperature of 250° C., with the flow rates of source gas $SiH_4/CH_4/H_2$ or $SiH_4/C_2H_4/H_2$ varying in the range from 10 sccm/10 sccm to 30 sccm/90 sccm, at a deposition gas pressure of 0.2 Torr, and at an RF power of 50 W.

Figure 5:
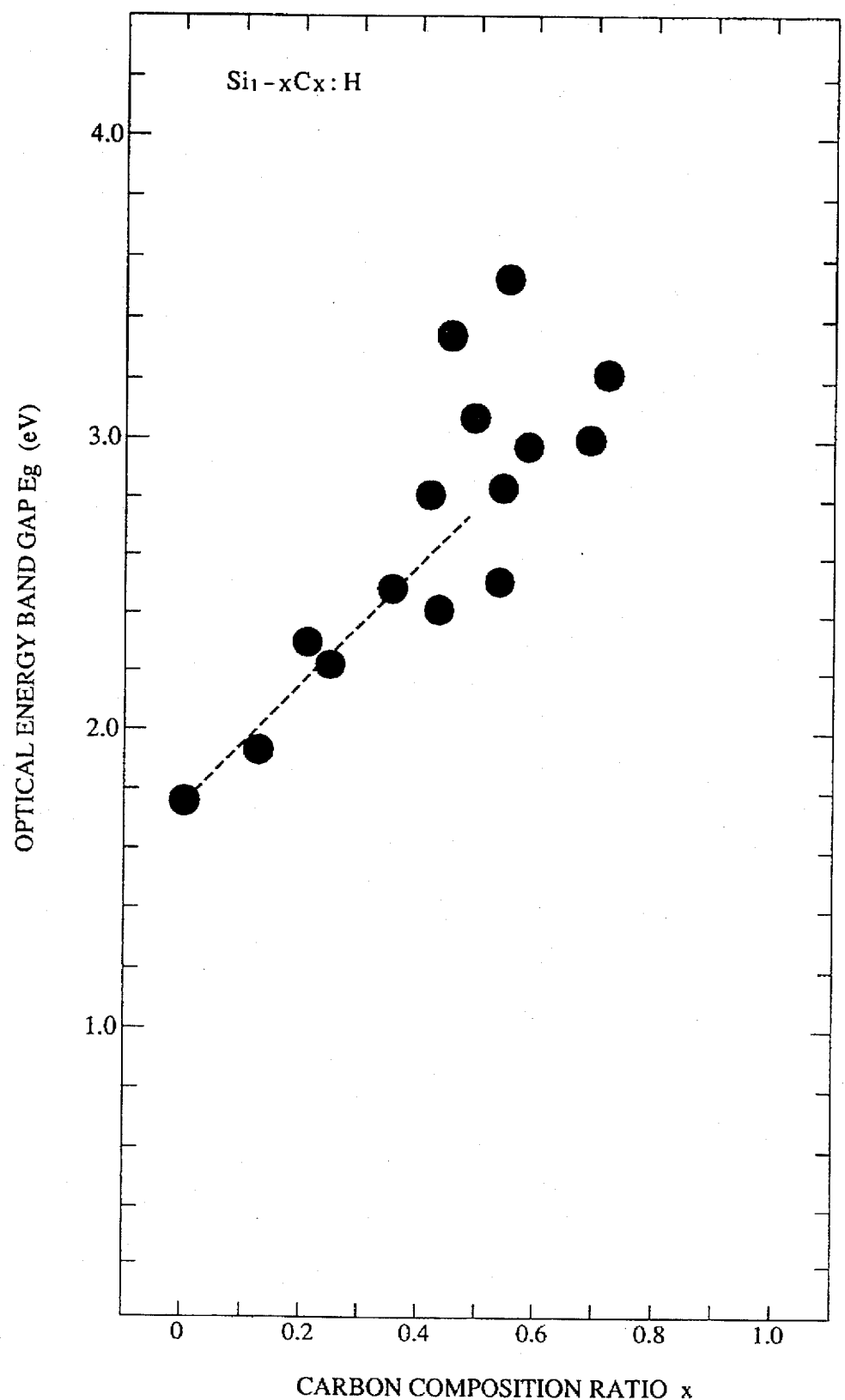
FIG. 5 is a graph illustrating a relationship between an optical energy bandgap of an a-$Si_{1-x}C_x$:H film and the carbon composition ratio of the film.

FIG. 5 shows the optical energy bandgap of the $Si_{1-x}C_x$:H film as a function of the carbon composition ratio x incorporated in the film. It has been believed that the optical energy bandgap of a $Si_{1-x}C_x$:H film corresponds to the carbon composition ratio. However, it can be seen from FIG. 5 that the $Si_{1-x}C_x$:H film formed under the conditions described above has an optical energy bandgap independent of the carbon composition ratio for the range of the carbon composition ratio larger than about 0.45 where the film has a very large optical energy bandgap such as 2.8 eV or greater.

Figure 4:
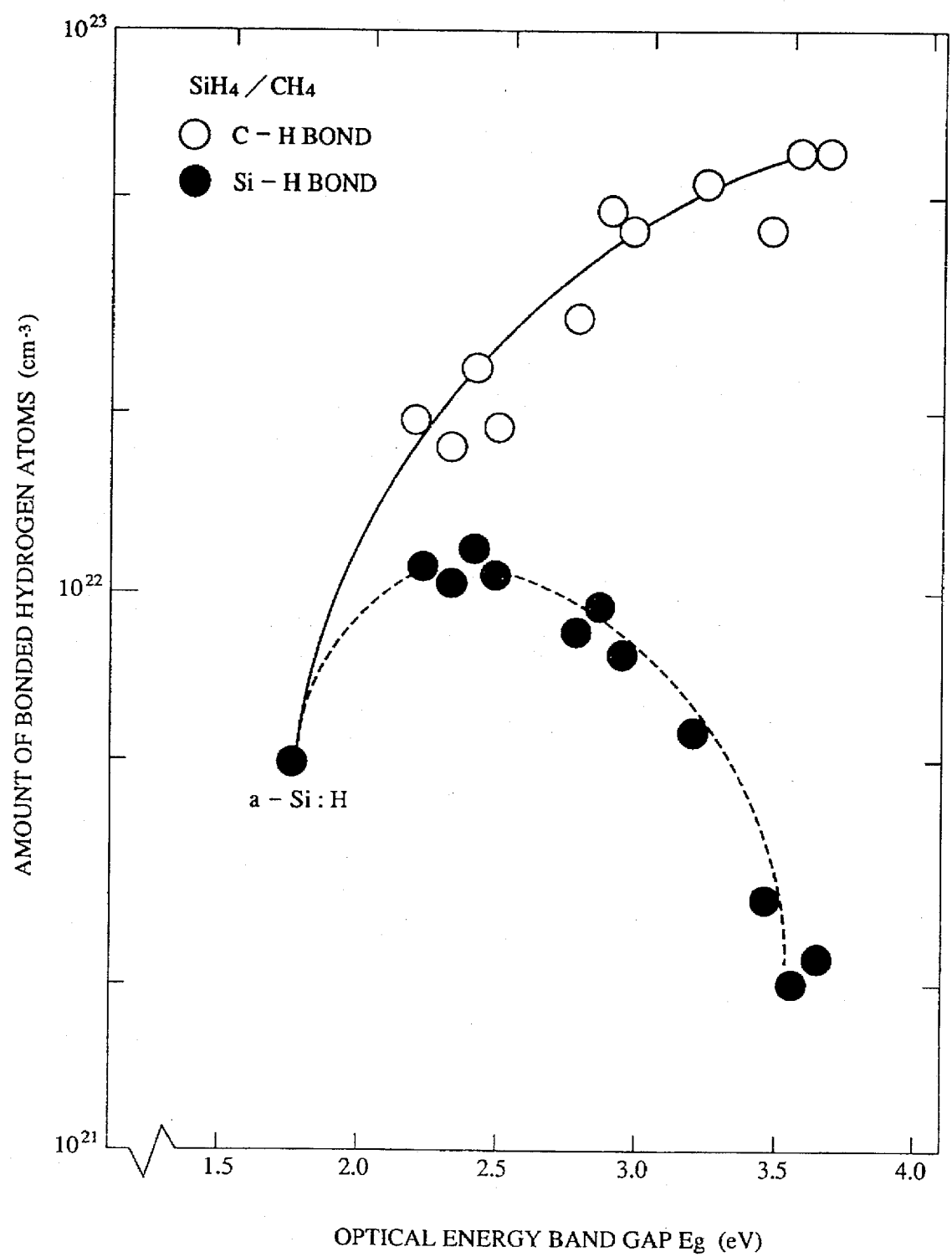
FIG. 4 is a graph illustrating a relationship between an optical energy bandgap of an a-$Si_{1-x}C_x$:H film and the amount of bonded hydrogen.

FIG. 4 shows a relationship between the optical energy bandgap of the $Si_{1-x}C_x$:H film of FIG. 5 and the amount of incorporated hydrogen atoms, in which the amount of hydrogen atoms bonded to silicon atoms (Si—H bond) in the film and that bonded to carbon atoms (C—H bond) were respectively determined by means of infrared absorption measurement. It can be seen from this figure that there is good correspondence between the amount of hydrogen atoms and the optical energy bandgap.

Conventionally, much effort has been made to increase the amount of carbon incorporated in the $Si_{1-x}C_x$:H film so that the film may have a large optical energy bandgap. However, it can be understood from FIG. 4 that the optical energy bandgap depends on the amount of hydrogen rather than carbon.

It can also be seen that it is desirable that the ratio of Si-H bonds to C—H bonds, (Si—H)/(C—H), be larger than five so as to obtain an optical energy bandgap larger than 2.8 eV, or more preferably larger than 3.0 eV. When the $Si_{1-x}C_x$:H film was formed by using $CH_4$ as source gas, the obtained film showed a large optical energy bandgap having good correspondence to the amount of bonded hydrogen. However, when $C_2H_4$ was used as source gas, the film did not show good correspondence between the optical energy bandgap and the amount of bonded hydrogen. This suggests existence of unstable bond or double bond of a carbon atom contained in a gas molecule, although $C_2H_4$ is more easily decomposed and the carbon atoms are more easily incorporated into the resulting film than in the case of $CH_4$. That is, it can be understood that when $CH_4$ is used, the amount of unstable carbon atoms is less than in the case of $C_2H_4$, and hydrogen atoms can be bonded to carbon atoms in a stable state, which results in a large optical energy bandgap.

Figure 6:
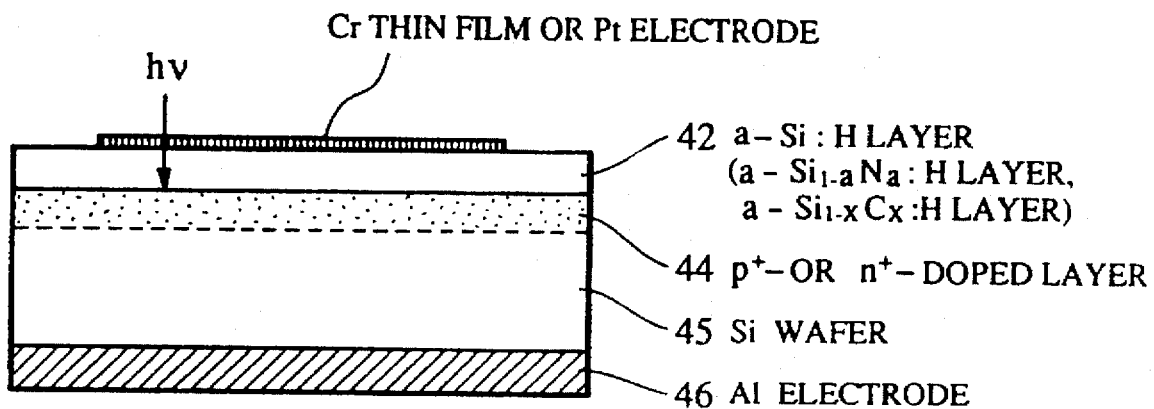
FIG. 6 is a schematic diagram showing a cross section of a sample to be subjected to IPE (internal photoelectron emission) measurement.

The valence band discontinuity (ΔEv) which occurs due to the difference in optical energy bandgap at the interface between p-or n-type single-crystal silicon and the above-described a-Si:H film, a-$Si_{1-x}C_x$:H film, or a-$Si_{1-a}N_a$:H film can be determined for example by mean of IPE (internal photoelectron emission) measurement by using a sample such as that shown in FIG. 6.

The sample shown in FIG. 6 can be obtained as follows. A $p^+$- or $n^+$-doped layer 44 is formed on one face of a Si wafer 45 by means of ion implantation. Then, a-Si:H film, a-$Si_{1-x}C_x$:H film, or a-$Si_{1-a}N_a$:H film 42 having a desired thickness in the range from 200 Å to 400 Å is formed on the doped layer 44, and further Cr or Pt thin film electrode 41 is formed on it. An Al electrode 46 is formed on the other face of the n-type Si wafer 45.

The principle of IPE measurement will be briefly described below.

The IPE measurement is carried out by exposing the sample to light which is capable of passing through the a-Si:H film, a-$Si_{1-x}C_x$:H film, or a-$Si_{1-a}N_a$:H film deposited on the single-crystal silicon (c-Si) so that the light is incident on the face on which the film is formed. After the light has passed through the above-described film, the light generates electron-hole pairs in the single-crystal silicon. If the bias voltage applied between the electrodes is varied, when the applied voltage comes to supply an energy greater than that corresponding to ΔEv or ΔEc, either generated holes or electrons become able to move over the barrier of ΔEv or ΔEc. As a result, the increase in photocurrent will be observed, which makes possible to estimate the value of ΔEv and ΔEc.

The method of IPE measurement is also described for example in Appl. Phys. Lett. 50 (1987) pp. 326–328.

Figure 7:
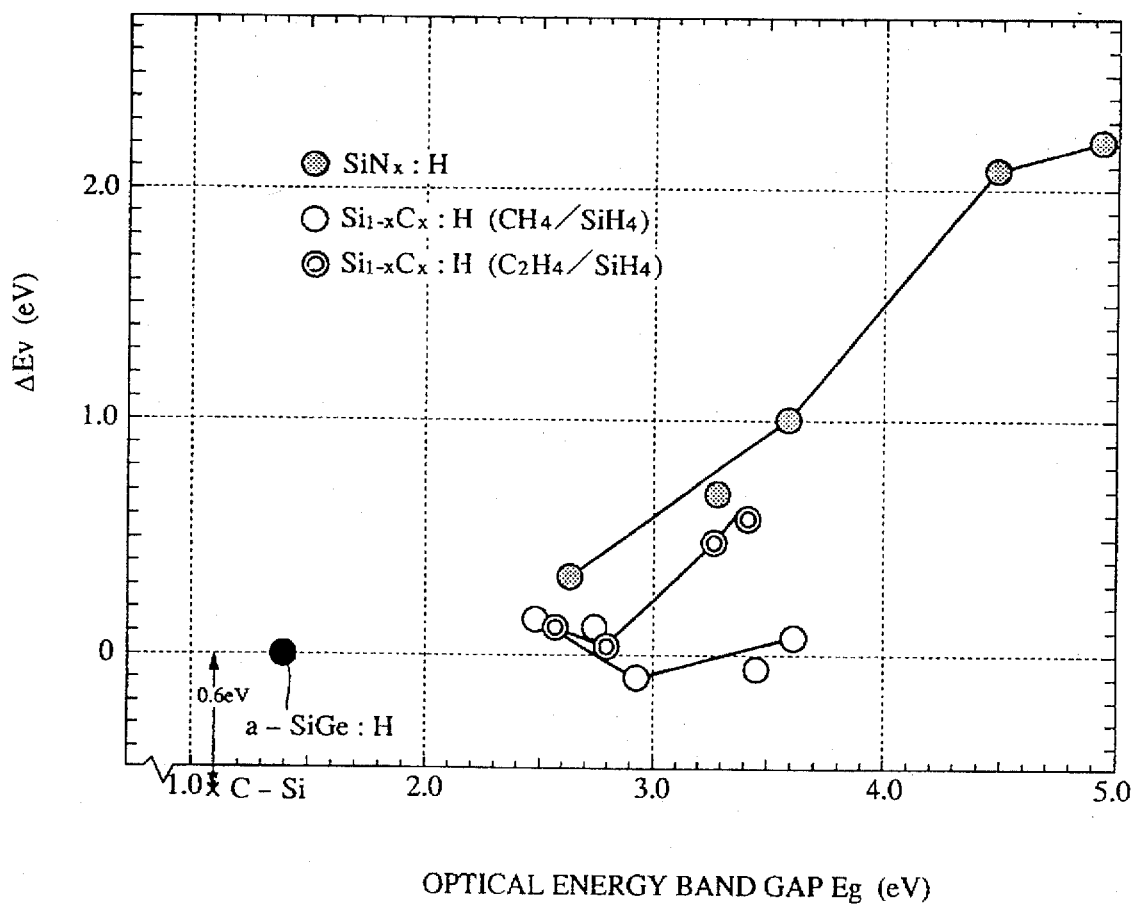
FIG. 7 is a graph illustrating valence band discontinuity (ΔEv) as a function of optical energy bandgap.

Referring to FIG. 7, the IPE measurement results will be explained below.

The IPE measurement was carried out to determine ΔEv and ΔEc induced between c-Si and each film described above. From these measurements, it has been concluded that ΔEv between c-Si and an a-Si:H film is about 0.6 eV. Considering the fact that the optical energy bandgaps of c-Si and a-Si:H are about 1.1 eV and about 1.7 eV, respectively, ΔEv is plotted in FIG. 7 for the a-$Si_{1-x}C_x$:H film and the a-$Si_{1-a}N_a$:H film in such a manner that the above-described value (=0.6 Ev) of ΔEv associated with the heterointerface between c-Si and a-Si:H is subtracted from ΔEv for these films so that the results may indicate the values relative to a-Si :H.

In the a-$Si_{1-a}N_a$:H film, as shown in FIG. 7, ΔEv relative to a-Si:H increases from 0.3 eV to 2.2 eV as the optical energy bandgap increases (from 2.6 eV to 4.9 eV), which means that ΔEc increases from 0.6 eV to 1.0 eV. From this result, it can be seen that if a junction is formed between a-Si:H and a-$Si_{1-a}N_a$:H, energy band discontinuity will occur on both sides of conduction and valence bonds.

The a-$Si_{1-x}C_x$:H film formed by using $C_2H_4$ as source gas has an optical energy bandgap in the range from 2.5 eV to 3.4 eV which is smaller than that of the a-$Si_{1-a}N_a$:H film. However, if the heterojunction is formed between a-$Si_{1-x}C_x$:H film a-Si:H, ΔEv will be 0.15 to 0.6 eV and thus ΔEc will be 0.7 eV to 1.1 eV, which means that energy band discontinuity will be induced on both sides of conduction and valence bands as in the case of a-$Si_{1-a}N_a$:H.

On the other hand, when an a-$Si_{1-x}C_x$:H film is formed by using $CH_4$ as source gas according to the present invention, ΔEv has an approximately constant value of 0.1 eV to 0.2 eV even for a large optical energy band such as 3.6 eV, which is similar to the case of a-Si:H. This means that the heterointerface a-$Si_{1-x}C_x$:H/a-Si:H formed by using $CH_4$ will have energy band discontinuity substantially only on the conduction band side, and there is no discontinuity in the valence band. This can be understood by considering the influence of the incorporation of hydrogen atoms. That is, when the film is formed from a source gas of $CH_4$, the optical energy bandgap of the obtained film is widened by stable bonding hydrogen atoms and thus almost no shift occurs in the valence band. This can also be understood by considering the fact that shift occurs in the valence band of $Si_{1-x}C_x:H$ formed from $C_2H_4$.

Figure 8:
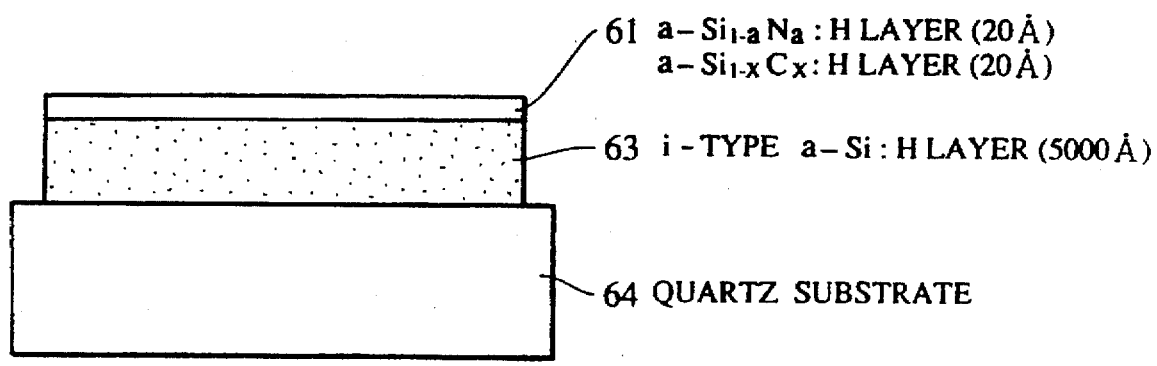
FIG. 8 is a schematic diagram showing a cross section of a sample to be subjected to XPS (X-ray photoelectron spectroscopy) measurement.

To further investigate the valence band discontinuity ($\Delta Ev$) at the heterointerface between the a-Si:H and other materials, samples for XPS (X-ray photoelectron spectroscopy) measurement were prepared as shown in FIG. 8 in which the cross section of a sample is illustrated. As can be seen from FIG. 8, the sample comprises a quartz substrate 64, a 5000 Å i-type a-Si:H film 63 formed on the substrate 64, and a 20 Å a-$Si_{1-x}C_x$:H film or a-$Si_{1-a}N_a$:H film 61 formed on it.

Due to the X-ray penetration depth, the XPS measurement is capable of obtaining the information about the region from the surface to the depth of a few tens Å. Considering this capability of XPS, it is possible to obtain the information on the interface between a film 61 such as $Si_{1-x}C_x$:H and an a-Si:H film 63 if the thickness of the $Si_{1-x}C_x$:H film 61 is in the range from 10 Å to 50 Å, as shown in FIG. 8. Especially, from the XPS measurement on such a sample, it is possible to obtain the information on the valence band structure formed with bond energy in the range from 0 eV to 50 eV. That is, the valence band of a-Si:H composed of hybrid orbital, Si3p and Si3s, is mixed with the valence band of a-$Si_{1-x}C_x$:H whose bond energy is made different from that of a-Si:H by addition of carbon atoms, and thus shift occurs in the valence band edges (VBE). These band edge positions were measured relative to the energy of spectrum of the Si2p level, and the results were compared to the valence band edge (VBE) of a-Si:H so as to obtain the discontinuity $\Delta Ev$ at the interface with a-Si:H.

XPS measurement showed the result similar to that shown in FIG. 7 obtained by IPE (internal photoelectron emission) measurement, that is, it was shown that the valence band discontinuity $\Delta Ev$ associated with $Si_{1-a}N_a$:H increases as the optical energy bandgap increases, and that the valence band discontinuity associated with a-$Si_{1-x}C_x$:H has a substantially constant value in the range from 0 to 0.2 eV even if its optical energy bandgap is widened to a large value such as 3.6 eV by varying the flow rate ratio $CH_4/SiH_4$.

Figure 1:
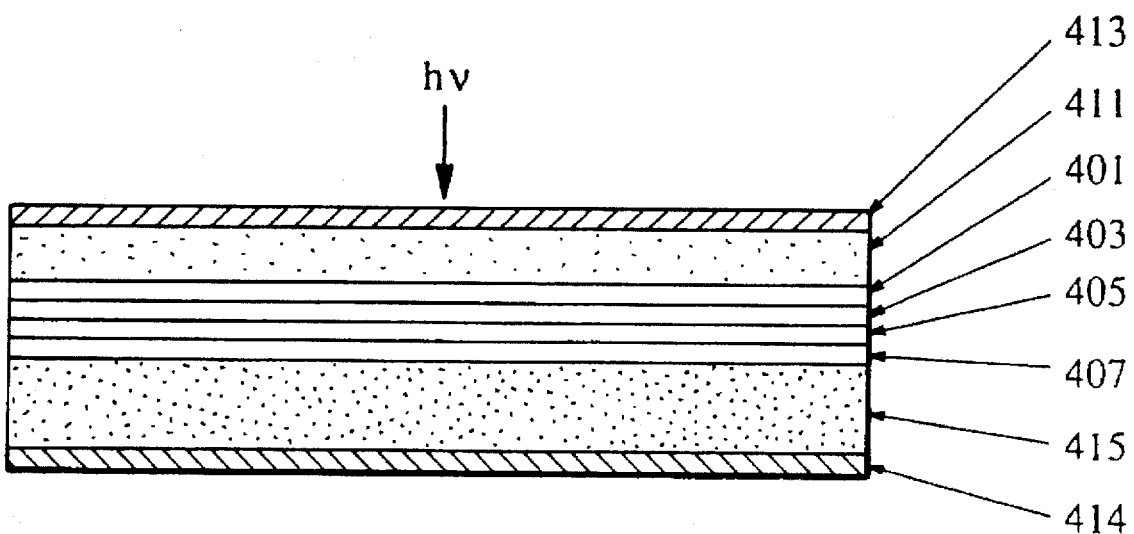
FIG. 1 is a cross-sectional view of a prior art of avalanche photodiode (APD) type photoelectric conversion device.
Figure 2A:
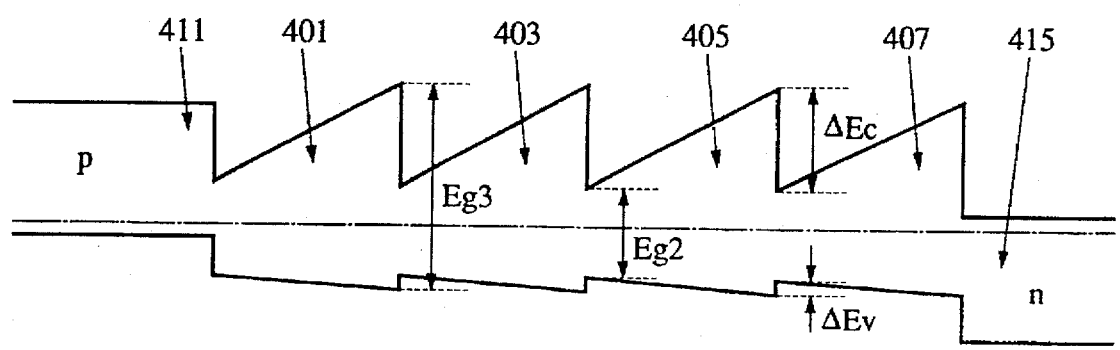
FIG. 2a is an energy band diagram illustrating a state in which no electric field is applied.
Figure 2B:
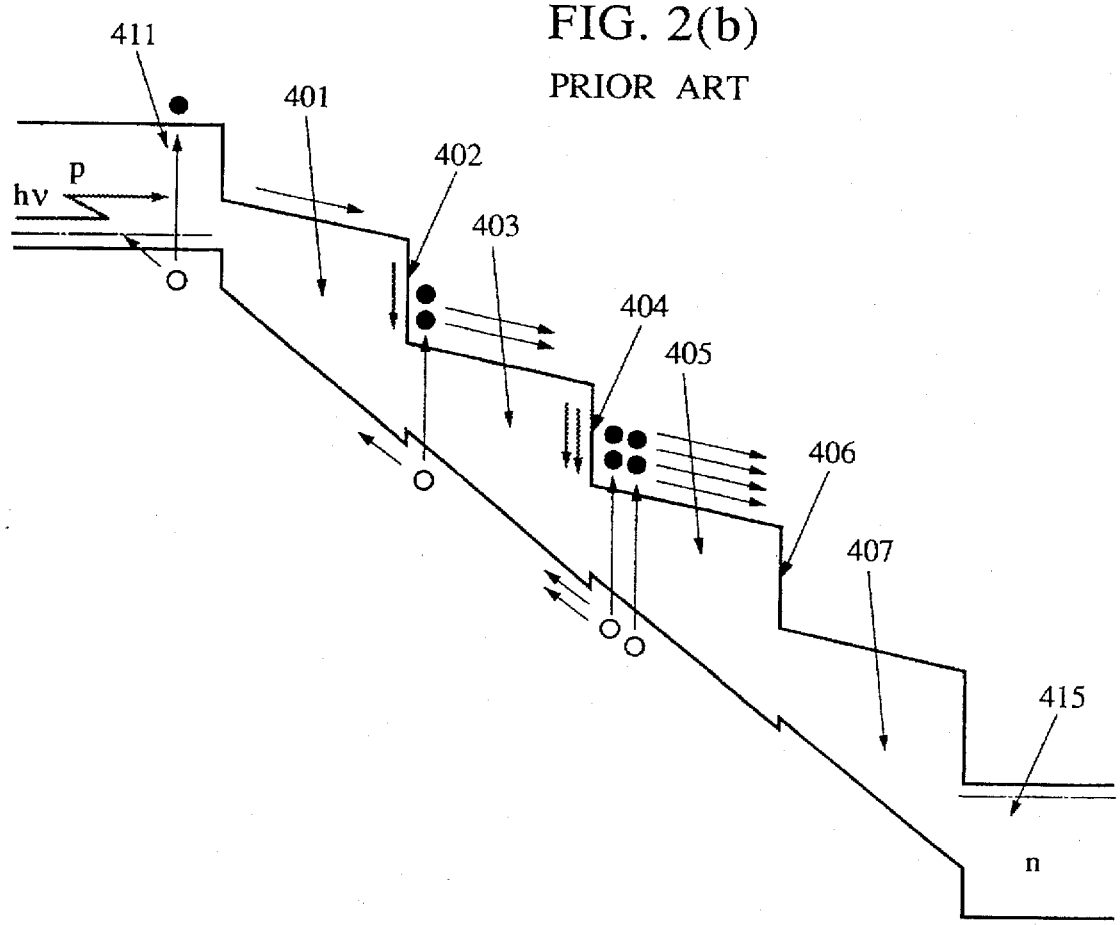
FIG. 2b is an energy band diagram illustrating an operating state in which high electric field is applied.
Figure 3:
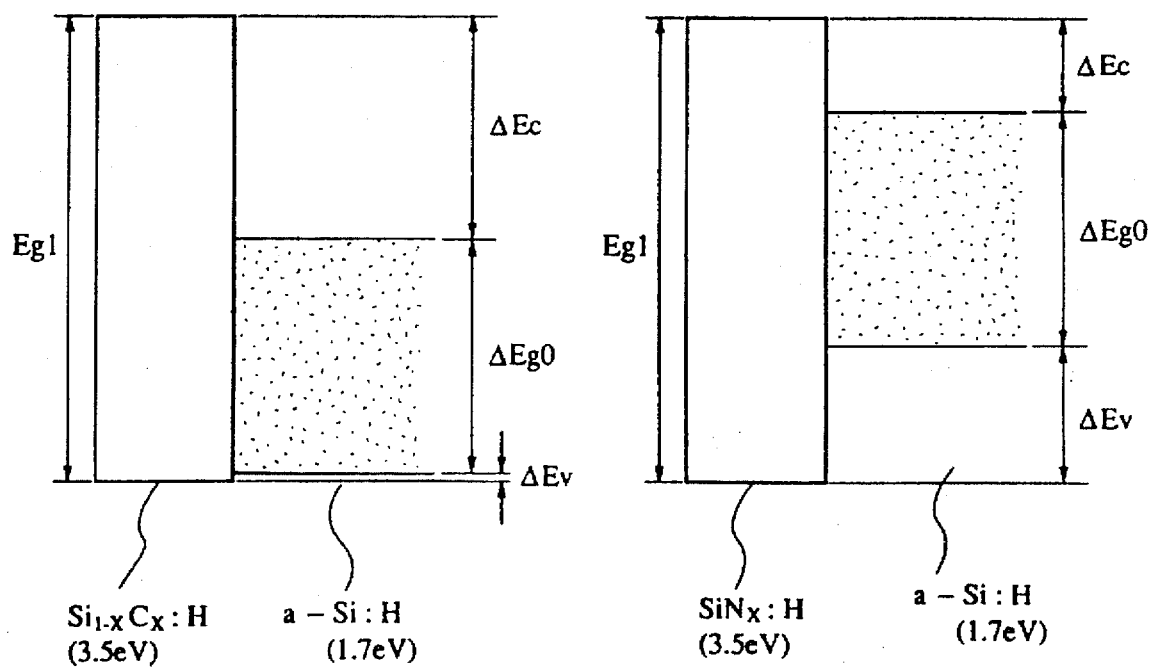
FIG. 3 is a schematic illustrating discontinuity in energy bands of a semiconductor heterojunction.

FIG. 3 shows schematically energy band discontinuities in semiconductor heterojunction systems. In $Si_{1-a}N_a$:H/a-Si:H, discontinuities $\Delta Ec$ and $\Delta Ev$ occur in both of the conduction and valence bands, as shown on the right side of FIG. 3. In contrast, $Si_{1-x}C_x$:H/a-Si:H for use in a thin film semiconductor device in accordance with the present invention has discontinuity only in the conduction bands.

It has been described above on the discontinuity only for the heterointerface with a-Si:H. However, because there is substantially no discontinuity between a-SiGe:H and a-Si:H as shown in FIG. 7, $Si_{1-x}C_x$:H/a-SiGe:H also has discontinuity only in the conduction band as in the case of $Si_{1-x}C_x$:H/a-Si:H.

A $Si_{1-x}C_x$:H film which forms substantially no discontinuity in the valence band can be easily obtained by controlling plasma-assisted CVD conditions of film deposition processing.

Figure 9:
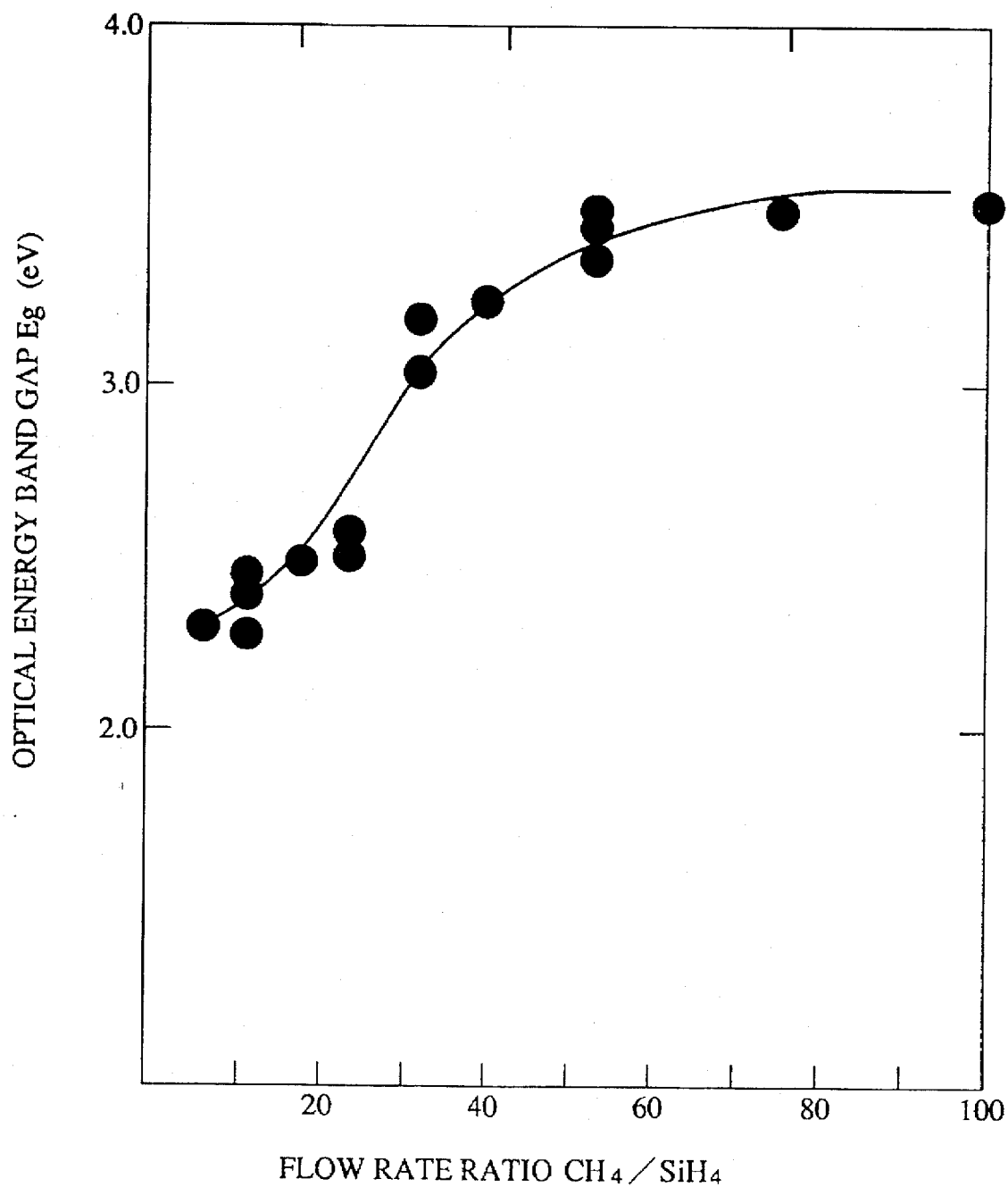
FIG. 9 is a graph illustrating a relationship between the ratio of the flow rate of $CH_4$ to that of $SiH_4$ and optical energy bandgap.

FIG. 9 shows the relationship between the optical energy bandgap and the ratio of the flow rate of $CH_4$ to that of $SiH_4$ during plasma-assisted CVD processing. From this figure, it can be seen that the optical energy bandgap increases abruptly over 3.0 eV up to 3.6 eV when the flow rate ratio $CH_4/SiH_4$ exceeds 30. Before the present invention, no investigation has been carried out on such a high flow rate ratio $CH_4/SiH_4$, because saturation of carbon atoms incorporated into a film has been observed when the flow rate ratio becomes larger than 10 or 20. However, it has been found that in the range of the flow rate ratio larger than 30, the optical energy bandgap may further become large independently of the carbon composition ratio, if the film is formed under a certain condition according to the present invention. To obtain such a film, it is preferable to deposit the film by means of the reaction process which is dominated by the reaction rate on the deposition surface.

Figure 10:
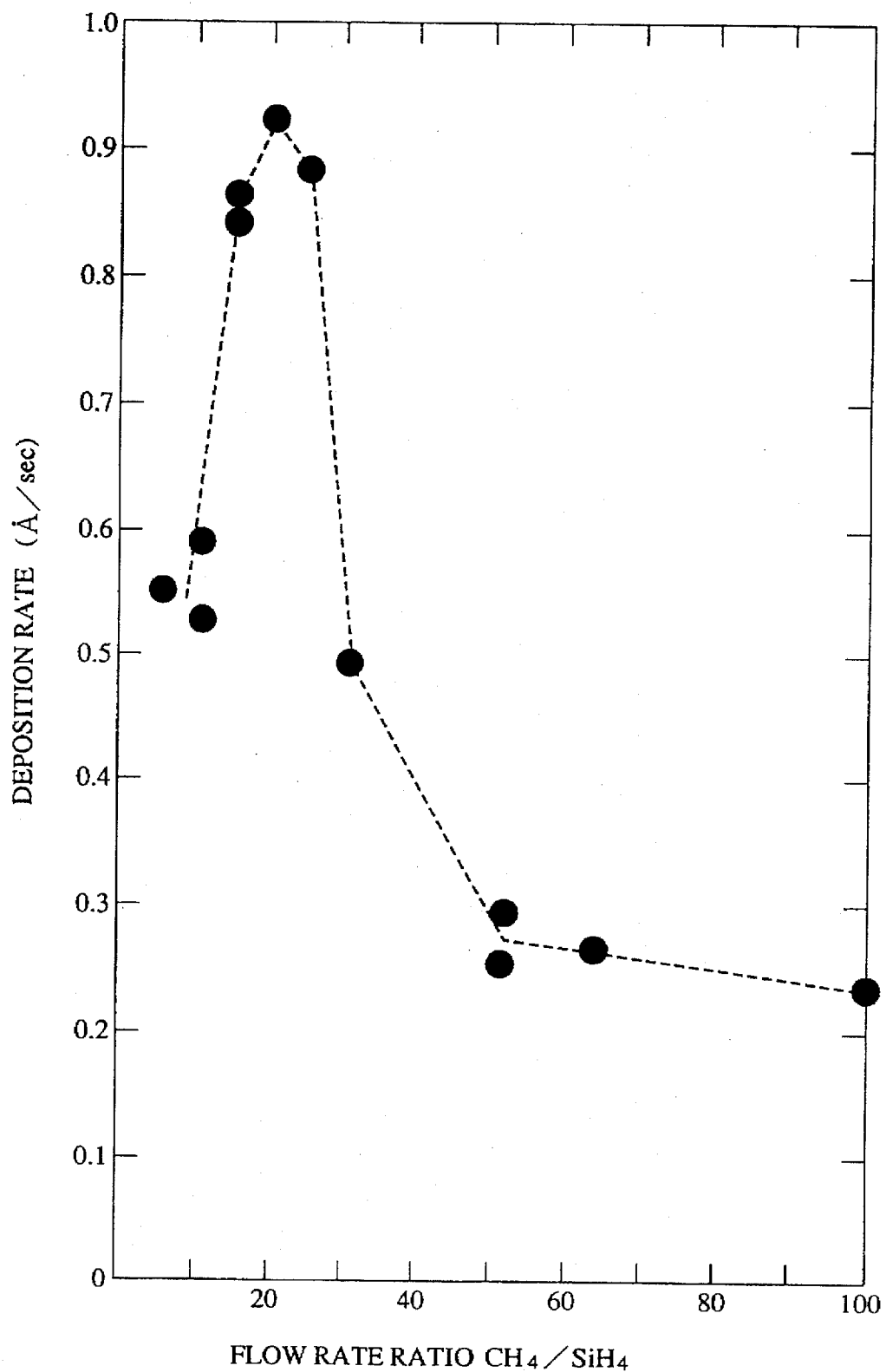
FIG. 10 is a graph illustrating a relationship between the ratio of the flow rate of $CH_4$ to that of $SiH_4$ and deposition rate.

The basic process of plasma-assisted CVD includes radical generation process in which source gas is decomposed by plasma excitation and deposition process in which deposition of a film on the deposition surface occurs by means of surface reaction of the radicals. FIG. 10 shows the relationship between the deposition rate and the flow rate ratio $CH_4/SiH_4$. As can be seen from this figure, the deposition rate of the film increases first as the flow rate ratio $CH_4/SiH_4$ becomes large. This is because the deposition rate in this range of the film is determined by the generation and supply rates of carbon-based radicals. That is, in this range of deposition rate, the generation and supply of carbon-based radicals increase as relative amount of $CH_4$ gas increases. However, when the amount of carbon-based radicals becomes saturated after an enough amount of radicals have been supplied, the deposition rate of the film becomes dominated by the surface reaction. That is, the portions on the deposition surface where bonds are weak and unstable are etched by carbon-based radicals, and thus the deposition rate of the film goes down.

If substrate temperature during film deposition is decreased, the surface reaction rate becomes low, and thus radicals are deposited immediately on the surface without diffusing along the substrate surface to meet stable sites. As a result, higher deposition rate can be obtained. However, the obtained film will include unstable bonds and will be porous. On the other hand, if substrate temperature is increased during deposition processing, the radicals will be able to diffuse to meet sufficiently stable sites, and structure relaxation will occur due to surface reaction. Thus, it becomes possible to obtain a high density film which contains hydrogen atoms with a stable bond. This can be considered to be a reason why such a film can have a large optical energy bandgap maintaining $\Delta Ev$ small enough.

When $C_2H_4$ is used as source gas, the $C_2H_4$ gas is easily decomposed and thus it is difficult to make the deposition rate small enough to obtain a high quality film which does not include unstable carbon atoms.

As can be seen from the above description, it is possible to obtain a $Si_{1-x}C_x$:H film which forms absolutely or substantially no valence band discontinuity by means of plasma-assisted CVD by controlling the reaction with monitoring the deposition rate so that the flow rate ratio $CH_4/SiH_4$ may be larger than 30 and so that the deposition rate may be less than 0.5 Å/sec.

In the deposition process described above, the conditions, such as substrate temperature, depositon gas pressure, and RF power, other than the flow rate ratio may be freely selected as long as the deposition rate is less than 0.5 Å/sec.

It has been described that the $Si_{1-x}C_x$:H film according to the present invention is formed by using $SiH_4$, $CH_4$, and $H_2$.

However, $SiH_4$ may be replaced with one of silane compounds having chain structure such as $Si_2H_6$, $Si_3H_8$, $SiH_4H_{10}$, $SiF_4$, $Si_2F_6$, $SiH_3F$, and $Si_2H_2$, or one of silane compounds having cyclic structure such as $Si_4H_8$, $Si_5H_{10}$, $Si_6H_{12}$, wherein in all cases the flow rate ratio to $CH_4$ is larger than 30 and the deposition rate is less than 0.5 Å/sec. More preferably, the silicon atom mole ratio in the gas including Si is 1/30 of the carbon atom mole ratio in $C_2H_4$. For example, in the case where $CH_4$ and $Si_2H_6$ are used, it will be more preferable to make the flow rate ratio $CH_4/Si_2H_6$ larger than 60.

EMBODIMENT 1

Now, as a fist embodiment of a thin film semiconductor device in accordance with the present invention, a solar cell having a $Si_{1-x}C_x$:H thin film according to the present invention will be described below.

Figure 11:
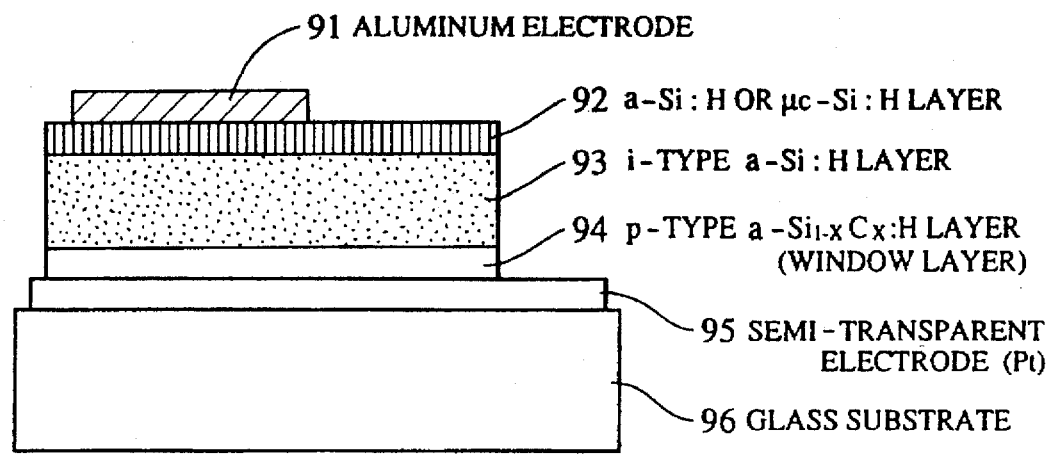
FIG. 11 is a cross-sectional view showing the structure of an example of a solar cell (photovoltaic device) according to the present invention.
Figure 12:
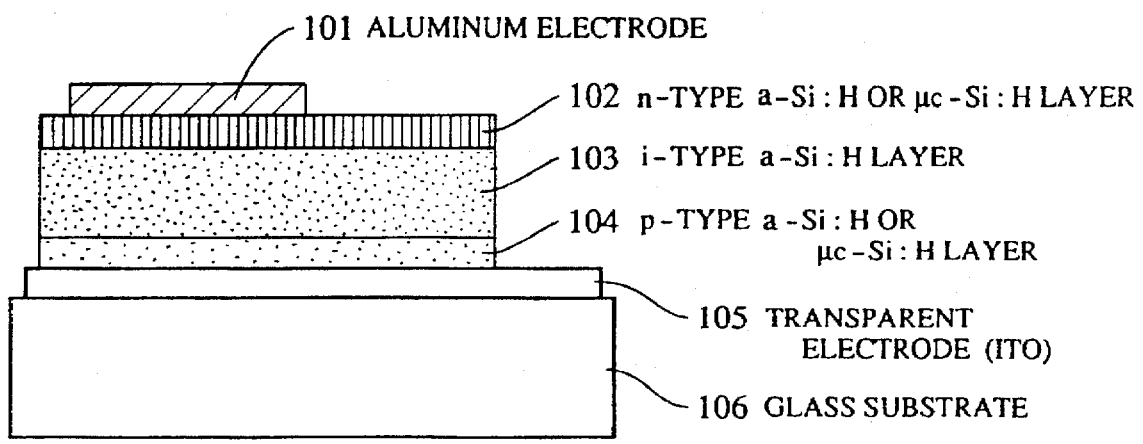
FIG. 12 is a cross-sectional view showing the structure of an example of a conventional solar cell.

FIG. 11 shows a cross section of a solar cell in according to the present invention, and FIG. 12 shows a cross section of a conventional solar cell with a-Si:H. In this embodiment of the present invention, as shown in FIG. 11, the device comprises: a glass substrate 96; a semi-transparent electrode 95 made up of for example Pt; an a-$Si_{1-x}C_x$:H layer 94 acting as a window layer; i-type a-Si:H layer 93; n-type a-Si:H layer or micro-crystal (μc) Si layer 92; and an aluminum electrode 91; wherein these elements are formed one on another in the above-described order from the bottom to the top. The device shown in FIG. 12 comprises a glass substrate 106; a transparent electrode 105 made up of for example ITO; p-type a-Si:H or μc-Si:H layer 104; i-type a-Si:H layer 103; n-type a-Si:H or μc-Si:H layer 102; and an aluminum electrode 101; wherein these elements are formed one on another in the above-described order from the bottom to the top. The device shown in FIG. 11 differs from the conventional p-i-n device with a-Si:H shown in FIG. 12 in that the transparent electrode on which light is incident of the conventional device is replaced with the semi-transparent electrode made up of Pt or the like, and that the p-type semiconductor layer acting as a window layer is replaced with the p-type $Si_{1-x}C_x$:H layer formed according to the present invention, wherein the p-type $Si_{1-x}C_x$:H layer is doped with boron by using $B_2H_6$ gas or $BF_3$.

The device shown in FIG. 11 can be fabricated according to the present invention as follows:

First, a semi-transparent electrode composed of Pt or the like is formed on a glass substrate by means of electron beam evaporation or sputtering. Alternatively, a transparent electrode such as ITO may also be used as in a conventional type of device. However, because the semiconductor thin layer used in the device in accordance with the present invention has a wider optical energy bandgap than the thin layer used as a window layer in a conventional device, a thin metal electrode is more preferable so that sunlight in a higher energy range may also pass through the electrode.

Then, a 100–500 Å semiconductor thin layer of $Si_{1-x}C_x$:H in accordance with the present invention is deposited by means of plasma-assisted CVD. Preferably, this thin layer is deposited by using $SiH_4$, $CH_4$, and $H_2$ gases with the flow rate ratio $CH_4/SiH_4$ of 50. To obtain a p-type layer, boron is doped in the layer by using $B_2H_6$ gas. A preferable ratio of the flow rate of $B_2H_6$ to that of $SiH_4$ is in a range from 0.01% to 1%, and more preferably, the ratio is 1%. In the deposition, the substrate temperature may be in the range from 100° C. to 350° C., and more preferably, the substrate temperature may be in the range from 150° C. to 250° C.

The preferable deposition gas pressure may be in the range from 50 mTorr to 1 Torr, and more preferable pressure may be in the range from 0.1 Torr to 0.5 Torr. The RF discharge power is preferably in the range from 1 W to 50 W, and more preferably, the RF power in the range from 1 to 10 W. As described above, it is important to select the deposition conditions so that the deposition rate may be less than 0.5 Å/sec.

Then, a 5000–10000 Å a-Si:H layer acting as a light absorption layer and an n-type a-Si:H or micro-crystal Si layer are formed by means of plasma-assisted CVD with RF glow discharge so as to complete the solar cell in accordance with the present embodiment of the invention. For the purpose of comparison, the device shown in FIG. 12 was also fabricated in such a manner that light absorption layer and n-type layer may be the same as those in the device shown in FIG. 11, and the ITO electrode and the p-type a-SiH or micro-crystal Si were formed in a common manner, and then both devices were evaluated.

Before the present invention, there is a known device which also has a window layer composed of p-type $Si_{1-x}C_x$:H formed by using plasma-assisted CVD. However, the practical value of the bandgap of the window layer for which the valence electrons can be controlled is less than 2.3 eV. As a result, although sunlight includes a wide range of wave lengths, most of high energy components of sunlight are absorbed by this p-type layer. In contrast, in the case of the $Si_{1-x}C_x$:H layer formed in accordance with the present invention, it is possible to obtain a high optical energy bandgap up to 3.6 eV, which means that a larger number of incident photons can reach the i-layer than in the conventional case. Thus, the device according to the present invention can generate a larger number of photo carriers. For these reasons, the device, shown in FIG. 11, with the $Si_{1-x}C_x$:H layer according to the present invention can provide a higher conversion efficiency than the conventional device.

In the conventional techniques, when the optical energy bandgap becomes larger than 2.3 eV, the number of dangling bond defects included in the $Si_{1-x}C_x$:H layer increases and abrupt degradation in electric conductivity occurs. As a result, a p-doped semiconductor layer cannot provide good characteristics in electron blocking and in hole transport. In contrast, if the $Si_{1-x}C_x$:H layer in accordance with the present invention is used in a thin film semiconductor device, no problems occur with electron blocking and it is possible to achieve good performance in hole transport due to the fact that $Si_{1-x}C_x$:H layer can form a heterointerface with a-Si:H or with a-$Si_{1-y}Ge_y$:H which has a large discontinuity ($\Delta Ec$) only in the conduction band and substantially no valence band discontinuity ($\Delta Ev$).

Furthermore, in a p-i-n structure according to conventional techniques, the discontinuity at a p-i interface is relaxed by using a graded layer acting as a buffer layer with a gradient in the carbon composition ratio. In contrast, the present invention can provide good performance without such a buffer layer, which results in simpler and easier production processes.

However the $Si_{1-x}C_x$:H film in accordance with the present invention has a large localized state density compared to a film having an optical energy bandgap of about 2.3 eV, which leads to degradation in carrier transport performance. In accordance with the present invention, this problem can be improved by using a thinner p-type layer than in the case of conventional techniques so that recombination of photo carriers may be reduced.

The $Si_{1-x}C_x$:H film according to the present invention is a dense film including hydrogen atoms with a stable bond, and thus has a saturated constant localized state density for the range of optical energy bandgap from 2.8 eV to 3.6 eV.

Thus, the present invention can provide good performance by optimizing the thickness and the optical energy bandgap of the $Si_{1-x}C_x:H$ film as described above. For example, if a solar cell is produced with a $Si_{1-x}C_x:H$ film having an optical energy bandgap of 3.6 eV and a thickness of 100 Å, then the solar cell provides a very large open-circuit voltage and thus provides an excellent fill factor and a high conversion efficiency, although it shows slightly smaller short-circuit current than a conventional solar cell having a p-type layer with an optical energy bandgap of 2.3 eV.

In the arrangement of the present embodiment, the $Si_{1-x}C_x:H$ film acts not only as a simple window layer but also as a light absorption layer which can absorb high energy components of sunlight.

In the present embodiment described above, the $Si_{1-x}C_x:H$ film according to the present invention is used as a p-type window layer. However, the p-i-n structure may be replaced with an n-i-p structure which can also provide higher conversion efficiency than the conventional device. In this case, the n-type layer may be produced by doping the layer with phosphorus using $PH_3$ gas instead of $B_2H_6$ or $BF_3$ gas.

The solar cell with a p-i-n structure described above may also be used as a primary photocurrent type photosensor by applying a reverse bias voltage.

Also in this case, good carrier blocking performance can be obtained under the reverse bias condition and enhancement in sensitivity to high energy light can be achieved. Moreover, the use of a thin semiconductor layer having a large optical energy bandgap according to the present invention makes a possible to realize a photosensor which can sense light in the near ultraviolet region.

In the arrangement according to the present embodiment described above, the i-layer is composed of a-Si:H. Alternatively, the i-layer may also be made up of a-$Si_{1-y}Ge_y$:H without inducing valence band discontinuity ($\Delta Ec$) as in the case of a-Si:H. In this case, the device will have sensitivity to longer wave lengths.

Alternatively, the i-layer may also be composed of a graded layer which can be formed by gradually changing the flow rate of $SiH_4$, $CH_4$, and $GeH_4$. In this case, the resulting device will be able to effectively sense a wide range of light from a short wave length to a longer wave length.

EMBODIMENT 2

Now, a superlattice structure with a plurality of a-$Si_{1-x}C_x$:H layers formed according the present invention will be described below. This superlattice structure may be adapted to a thin film semiconductor device such as a thin film transistor (TFT) and a secondary photo current type photosensor, which will be discussed in detail.

Figure 13:
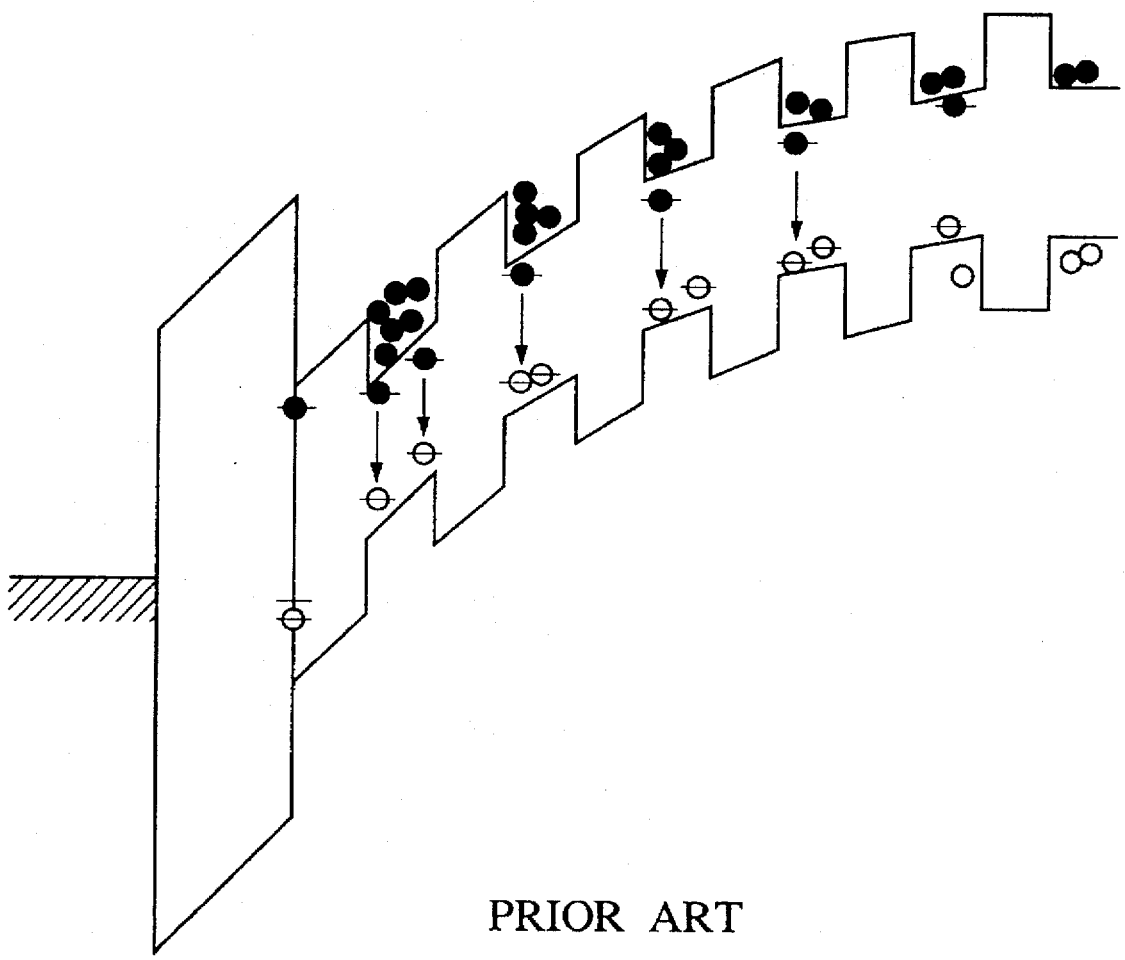
FIG. 13 is an energy band diagram for explanation of a thin film semiconductor device such as a TFT having a superlattice structure.

In general, amorphous silicon (a-Si) is advantageously used in a driving device for an active matrix type of liquid crystal display or in a driving device for a contact type of reading sensor used in a facsimile machine. However, amorphous silicon has irregular structure which results in localized states within a forbidden gap, which further results in a low carrier mobility. As a result, devices with amorphous silicon cannot operate at a high speed. One possibility of improving this problem is to use a superlattice structure with a plurality of semiconductor layers as a channel in a thin film transistor. This type of thin film transistor is expected to have a high carrier mobility because carriers are confined within potential wells as shown in FIG. 13 and this carrier confinement may lead to reduction in carrier scattering, and because carriers may not be trapped by interface states or by fixed charges at the interface with a gate insulating layer.

However, the expected improvement cannot be achieved in an actual thin film transistor or photosensor of this type, because in addition to electrons which contribute to conduction, there are holes accumulated within potential wells and these holes have a low mobility of a tenth more than equal of that of electrons, which limits the operation speed.

Figure 14:
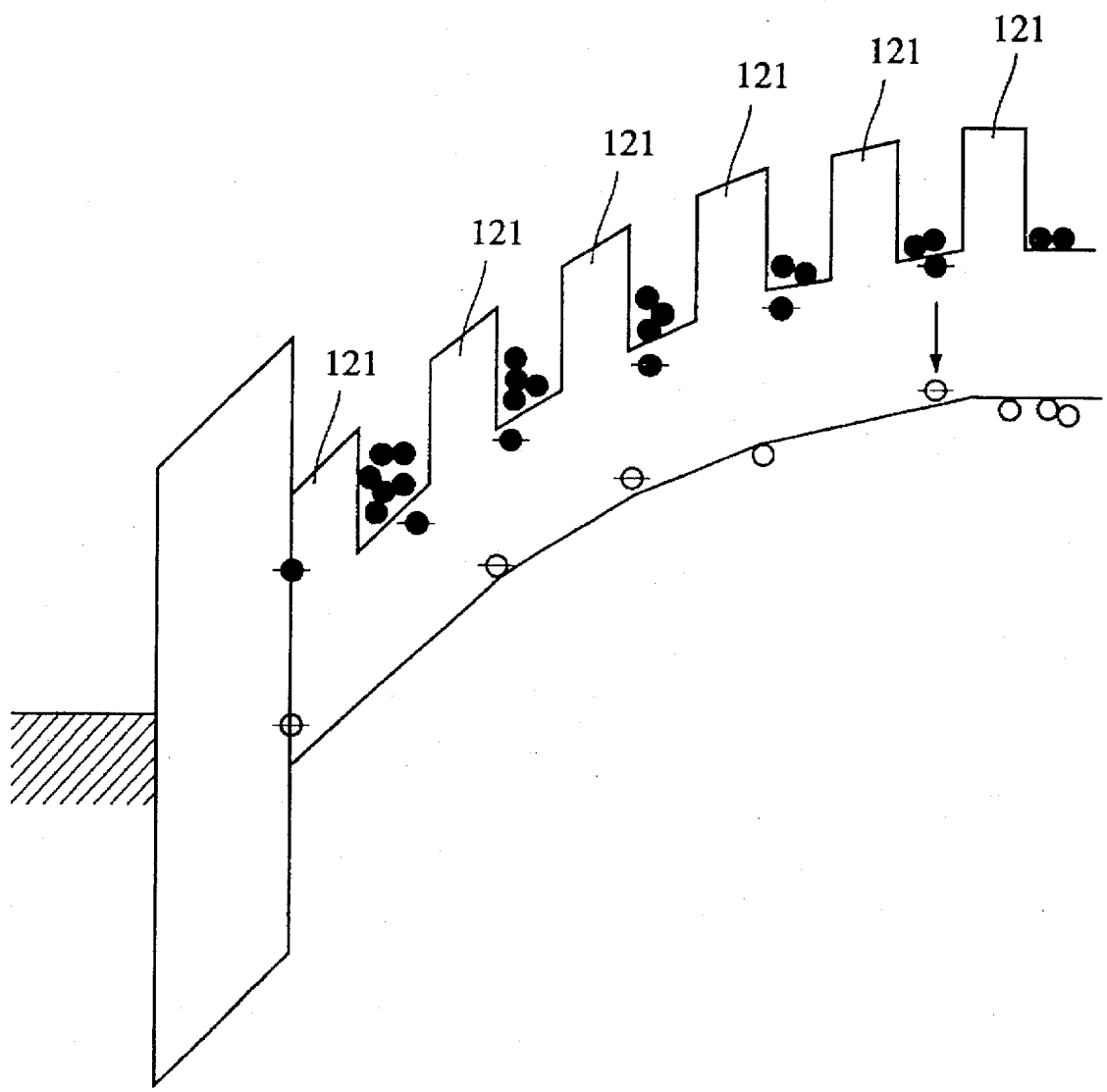
FIG. 14 is an energy band diagram of a thin film device according to one embodiment of the present invention.

If thin semiconductor layers according to the present invention are used as barrier layers 121 in the superlattice structure of a thin film transistor, the energy band structure will become as shown in FIG. 14. That is, there are potential wells for electrons in the conduction band as in the case of FIG. 13, however, there are no potential barriers for holes in the valence band because there are little discontinuities in the valence band. Thus, holes are not trapped and accumulated at that barrier, therefore recombination holes and electrons in said barrier are reduced. Accordingly, the electron mobility in the source-drain direction is improved, and the performance of the thin film transistor is increased.

EMBODIMENT 3

The following description will discuss the application of the present invention to a thin film light emitting device such as an LED and an EL having a superlattice structure with a plurality of a-$Si_{1-x}C_x$:H layers formed according to the present invention.

Figure 15:
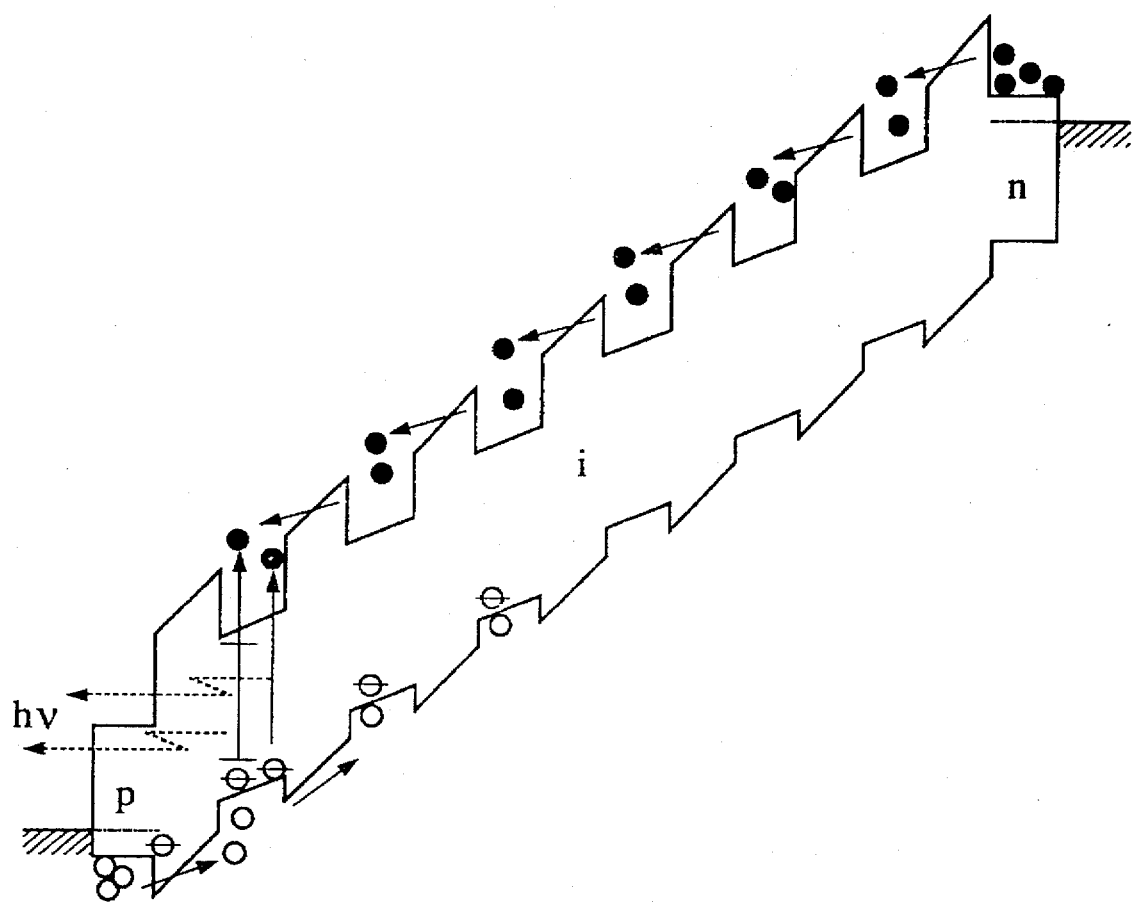
FIG. 15 is an energy band diagram of a conventional thin film light emitting device having a superlattice structure.
Figure 16:
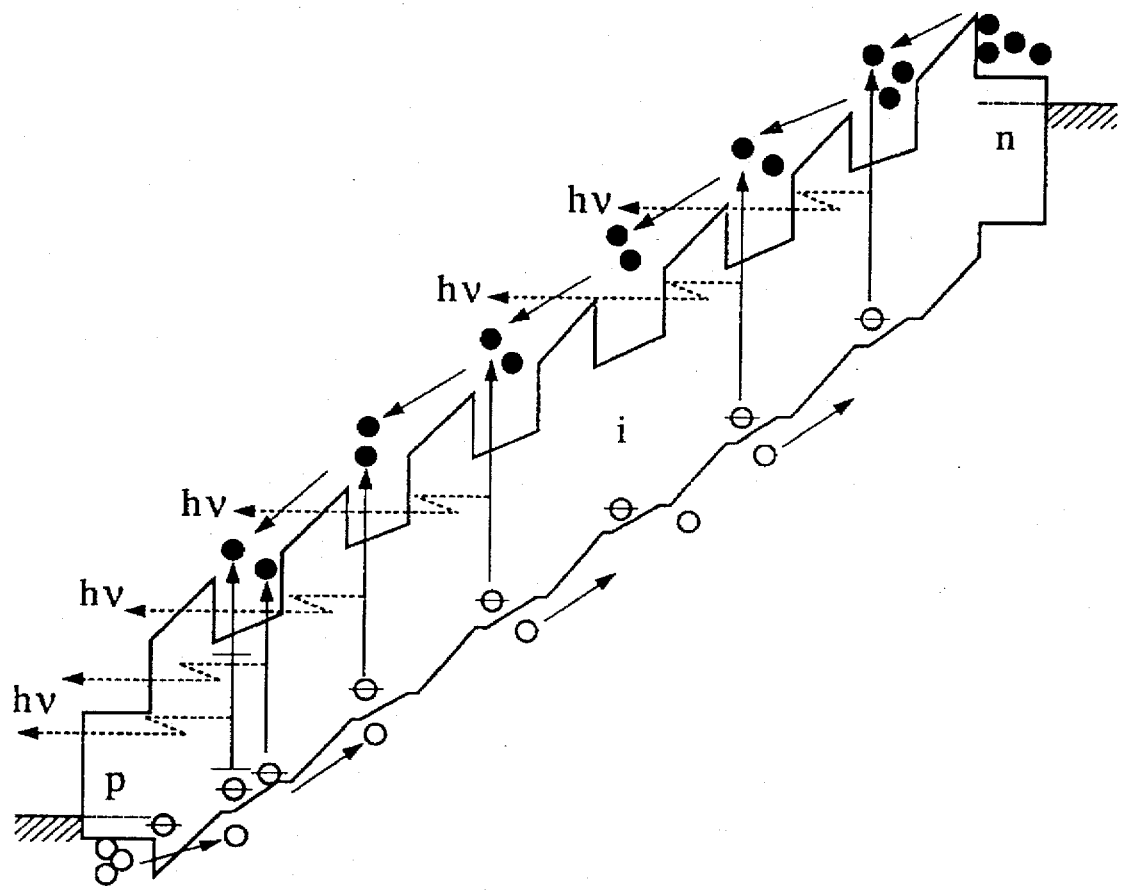
FIG. 16 is an energy band diagram of a thin film light emitting device in accordance with one embodiment of the present invention.

One known idea to increase the light emitting efficiency is to confine carriers within quantum wells composed of a plurality of layers as shown in FIG. 15. However, if there are discontinuities in the valence band as in FIG. 15, most of injected holes will be accumulated within a few quantum wells near the edge of the superlattice structure because of the low mobility of holes, and the holes in these quantum wells will disappear by recombining with electrons, which means that light emission due to recombination occurs only within a few layers near the edge from which holes are injected and the other layers do not contribute to light emission.

If the thin semiconductor layer and the method of producing it according to the present invention are applied to such a device, then the valence band discontinuity can be neglected and the injected holes will be limited only by electric drift field and by Coulomb force between the holes and the electrons accumulated within the wells. As a result, these holes can move relatively freely, and thus the electrons accumulated within the wells can combine with the holes in the entire light emission region. In this way, it will become possible to increase the light emission efficiency of an EL, LED or the like.

EMBODIMENT 4

Figure 17:
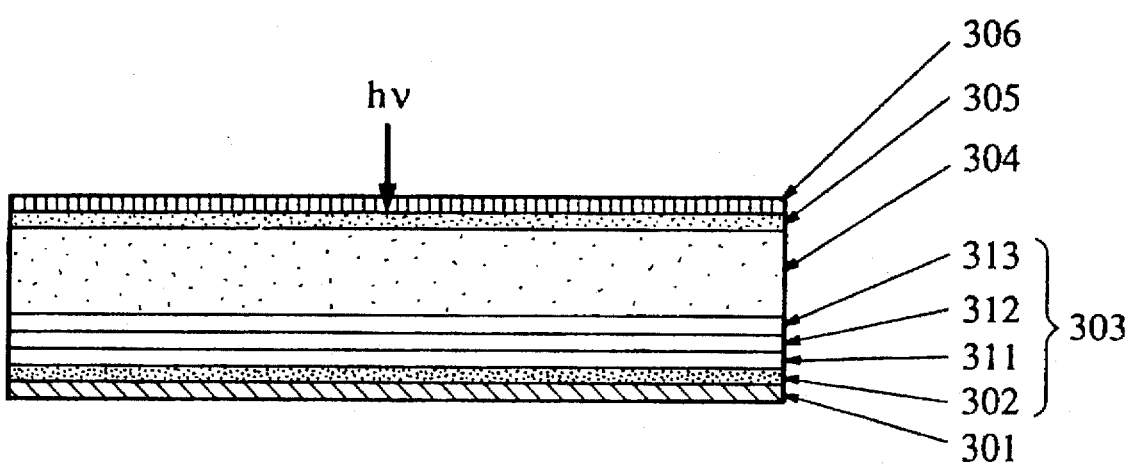
FIG. 17 is a cross-sectional view schematically showing a photoelectric conversion device in accordance with one embodiment of the present invention.

FIG. 17 is a cross-sectional view showing the structure of a photoelectric conversion device in accordance with the present invention. As shown in this figure, the device comprises a light absorption layer 304; multiplication layers 303 consisting of a plurality of bandgap-grading layers 311, 312, and 313; a p-type semiconductor layer 305 acting as a carrier injection barrier layer; an n-type semiconductor layer 302 acting as a carrier injection barrier layer; an electrode 306 electrically connected to the p-type semiconductor layer 305; and an electrode 301 electrically connected to the n-type semiconductor layer 302; wherein the light absorption layer 304 and the multiplication layers 303 are disposed between the p-type semiconductor layer 305 and the n-type semiconductor layer 302. The above-described carrier injection layers may also be in Schottky contact with an adjacent semiconductor layer. In this example, the multiplication layers 303 include three bandgap-grading layers, however the number of the bandgap-grading layers is not limited to three. The multiplication layer 303 may be composed of one or more bandgap-grading layers.

In the device of the present embodiment shown in FIG. 17, the electrode 301 is preferably made of Cr, and the layer 302 is a carrier injection barrier layer which is preferably composed of a 500 Å n-type a-$Si_{1-y}Ge_y$:H layer and which is used to protect holes from being injected. The multiplication layers 303 include bandgap-grading layers for carrier multiplication wherein the composition of the bandgap-grading layers is varied from a-$Si_{1-y}Ge_y$:H to a-$Si_{1-x}C_x$:H so as to obtain a gradient in energy bandgap. The light absorption layer 304 is a layer for absorbing light and for generating carriers, which is preferably composed of about 1 μm-thick a-Si:H. The layer 305 is a carrier injection barrier layer used to protect electrons from being injected, which is preferably composed of about 100 Å-thick p-type a-$SiC_x$:H layer. The electrode 306 is a transparent electrode which is preferably made mainly of indium oxide.

The Cr electrode 301 may be produced by means of electron beam evaporation and the transparent electrode 306 may be produced by means of sputtering. The carrier injection barrier layer 305, the light absorption layer 304, the multiplication layers 303, and the carrier injection barrier layer 302 may be produced by means of plasma-assisted CVD. These amorphous layers may be formed by using source gases such as: $SiH_4$, $GeH_4$, $PH_3$, and $H_2$ for the carrier injection barrier layer 302; $SiH_4$, $GeH_4$, $CH_4$, $B_2H_6$, and $H_2$ for the multiplication layers 303; $SiH_4$, and $H_2$ for the light absorption layer 304; $SiH_4$, $CH_4$, $B_2H_6$, and $H_2$ for the carrier injection barrier layer 305. The amorphous layers may be deposited at a temperature preferably in the range from 100° C. to 400° C., more preferably in the range from 150° C. to 350°, and most preferably at 200° C. The discharged gas pressure is preferably in the range from 0.05 Torr to 10 Torr, more preferably in the range from 0.1 Torr to 1.0 Torr, and most preferably 0.2 Torr.

The multiplication layers 303 include three layers 311, 312, and 313 each of which has a thickness of 200 Å and is formed by continuously changing the flow rates of $CH_4$, $GeH_4$, and $B_2H_6$ which are a part of source gases. The bandgap-grading regions of the multiplication layers may be formed in such a manner that the deposition of the layer is started with producing of the maximum energy bandgap portion by using $SiH_4$, $H_2$, and $CH_4$ gases, and then the flow rate of $CH_4$ is reduced gradually. When the flow rate of $CH_4$ has been reduced to zero, the $GeH_4$ flow is started and its flow rate is increased gradually to approach the minimum energy bandgap portion.

Figure 18A:
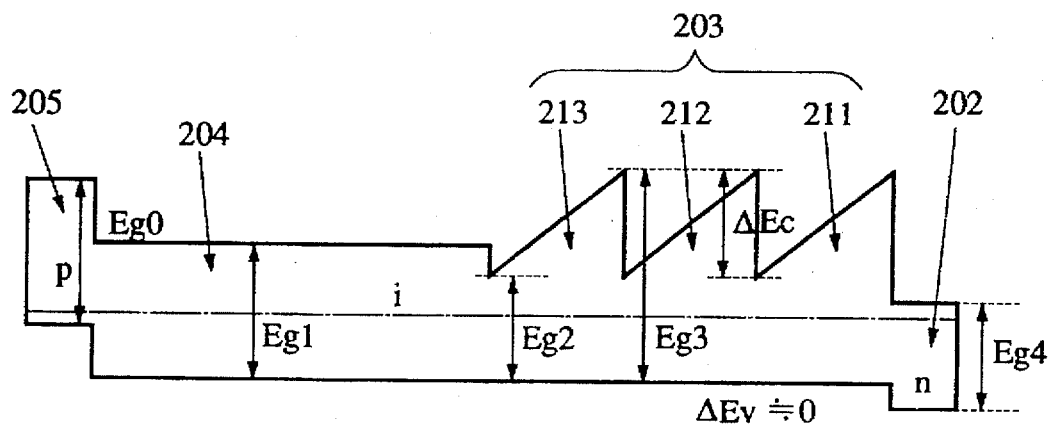
FIG. 18a shows a state where no electric field is applied and FIG. 18b shows a state where an electric field is applied.
Figure 18B:
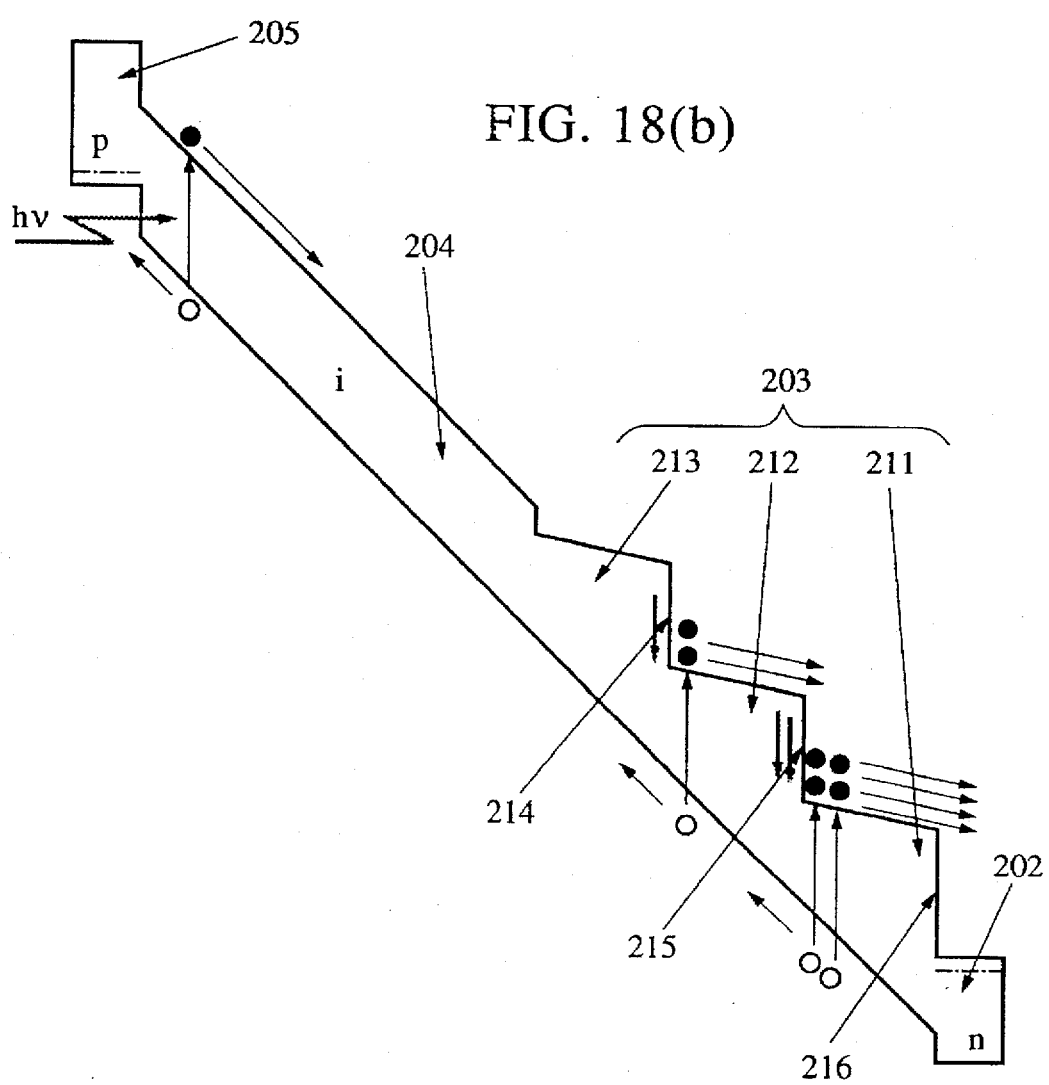

FIGS. 18a and 18b show the energy band structure of the photoelectric conversion device of the present invention shown in FIG. 17, wherein FIG. 18a shows a state where there is no applied electric field and FIG. 18b shows a state where an electric field is applied to the device.

As shown in FIGS. 18a and 18b, the n-type a-$Si_{1-y}Ge_y$:H layer 202 has an energy bandgap Eg, and the multiplication layers including three bandgap-grading layers 211, 212, and 213, whose composition varies from a-$Si_{1-y}Ge_y$:H to a-$Si_{1-x}C_x$:H, have a minimum energy bandgap $Eg_2$, and a maximum energy bandgap $Eg_3$. The a-Si:H layer 204 has an energy bandgap $Eg_1$, and the p-type a-$Si_1C_2$:H layer 205 has an energy bandgap $Eg_0$. In FIGS. 18a and 18b, there are also shown stepping back heterojunctions 214, 215, and 216. Typical value of the energy bandgap $Eg_1$ of the a-Si:H layer 204 is about 1.72 eV. The carbon composition ratio z of the p-type a-$Si_{1-z}C_z$:H layer 205 is preferably 0.2 and its energy bandgap is about 2.2 eV. In the maximum energy bandgap portion of the bandgap-grading layers 211, 212, and 213, the carbon composition ratio x of a-$Si_{1-x}C_x$:H relative to the silicon composition is about 0.5 and the corresponding energy bandgap is about 2.9 eV. To induce avalanche multiplication in the stepping back heterojunction regions, the energy bandgap of the a-$Si_{1-x}C_x$:H layer should be sufficiently large. Even in the case where the minimum energy bandgap portion is formed by using a-$Si_{1-y}Ge_y$:H the minimum energy bandgap which is attainable without degrading the photoelectric performance is about 1.4 eV. To induce avalanche multiplication, the heterointerface has to have a band discontinuity corresponding to the optical energy bandgap of a-$Si_{1-y}Ge_y$:H. Therefor, the optical energy bandgap of a-$Si_{1-x}C_x$:H has to be at least 2.8 eV. If a-Si:H is used instead of a-$Si_{1-y}Ge_y$:H, the minimum energy bandgap of a-Si:H which can be obtained without degrading the photoelectric performance is about 1.7 eV, and thus the optical energy bandgap of a-$Si_{1-x}C_x$:H has to be at least 3.4 eV.

The Ge composition ratio y of the a-$Si_{1-y}Ge_y$:H layer 202 is about 0.4 which is the same as the Ge composition of a-$Si_{1-y}Ge_y$:H in the minimum energy bandgap portions of the bandgap-grading layers 211, 212, and 213, and the corresponding energy bandgaps $Eg_2$ and $Eg_3$ are 1.4 eV and 2.9 eV respectively.

As shown in FIG. 18a, the maximum energy bandgap portion of a-$Si_{1-x}C_x$:H is in contact with the minimum energy bandgap portion of a-$Si_{1-y}Ge_y$:H without large discontinuities in the valence bands, and the discontinuities exist only in conduction bands. Thus, the magnitude of the conduction band discontinuity is about 1.5 eV which corresponds to the difference in energy bandgaps.

To induce avalanche multiplication in the stepping back heterojunction regions in the arrangement of the present invention, it is required to have a sufficiently large difference between the maximum energy bandgap and the minimum energy bandgap. It is further required to form a discontinuity only in the valence band or conduction band.

Thus, the a-$Si_{1-x}C_x$:H layer for use in the arrangement of the present invention should be formed such that the requirements described above may be satisfied. An example of the deposition conditions to obtain such an a-$Si_{1-x}C_x$:H layer is as follows: The substrate temperature is 200° C., the gas pressure is 0.2 Torr, the RF power is 10 W, the gas flow rates of $CH_4$ and $SiH_4$ are 100 sccm and 2 sccm, respectively, and the deposition rate is 0.2 Å/sec. If an a-$Si_{1-x}C_x$:H layer is deposited under these conditions, the optical energy bandgap will be 2.9 eV. If the resulting a-$Si_{1-x}C_x$:H layer is in contact with a-Si:H or a-$Si_{1-y}Ge_y$:H, the valence band discontinuity ΔEv will be about 0 eV.

As shown in FIGS. 18a and 18b, neither spikes nor notches appear even under a high electric field or under a weak electric field in the photoelectrical conversion device produced according to the present embodiment.

The photoelectrical conversion device according to the present embodiment has a multiplication factor of about 10 which is independent of a bias voltage in the range of 10 V to 20 V. The excess noise arising from multiplication is as low as 1.05. The dark current is also as low as 1 nA/$cm^2$. The device has a high response speed similar to that of a p-i-n type device having no multiplication layers.

In this embodiment described above, the multiplication layers include three bandgap-grading layers, which has been shown just as one example. The multiplication layers may include an arbitrary number of bandgap-grading layers as required to achieve a desired multiplication factor.

In this embodiment described above, the heterojunction has an abrupt stepping back interface in the conduction band. However, similar effects may be obtained by using a gradual heterojunction as long as the length of the interface region is less than a mean free path of electrons. Even more gradual heterojunction may be used if it may provide required effects.

In this embodiment described above, the thickness of the bandgap-grading layer is 200 Å. This layer may have an arbitrary thickness in the range where carriers can pass through the layer without recombination. However, a thinner layer is preferable because the bias voltage can be reduced. In this embodiment, the thickness of the light absorption layer is 1 μm. However, the light absorption layer may have an arbitrary thickness as long as light does not pass through the absorption layer reaching the multiplication layers. The limit of this thickness depends on the light absorption coefficient.

In this embodiment described above, the amorphous layers are formed by using source gases including $SiH_4$, $B_2H_6$, $PH_3$, $CH_4$, $GeH_4$. $B_2H_6$, may be replaced with another gas containing atoms in column III of the periodic table such as B, Al, In, or Tl. $PH_3$ may be replaced with another gas containing atoms in column V of the periodic table such as P, As, Sb, or Bi. $GeH_4$ may be replaced with another Ge compound such as $GeF_4$ or tin compound such as $SnH_4$. The composition ratio of the bandgap-grading layers is preferably in the range from 0 to about 0.6 to reduce the localized state density. In addition to plasma-CVD, the amorphous layers may also be produced by means of ECR plasma.

In this embodiment described above, the amorphous layers are used as semiconductor layers. However, another type of non-single crystal such as poly-crystal may also be used. The energy bandgap and doping level of the carrier injection barrier layers may be freely designed as long as these layers can prevent minority carriers from being injected and as long as majority carrier transport performance is not degraded.

EMBODIMENT 5

The following description will discuss the application of the production method described in EMBODIMENT 4 to a device such that the photoelectrical conversion device may be formed on a scanning and read-out circuit which has been disclosed in Japanese Patent Application Laid-Open No. 63-278269.

Figure 19A:
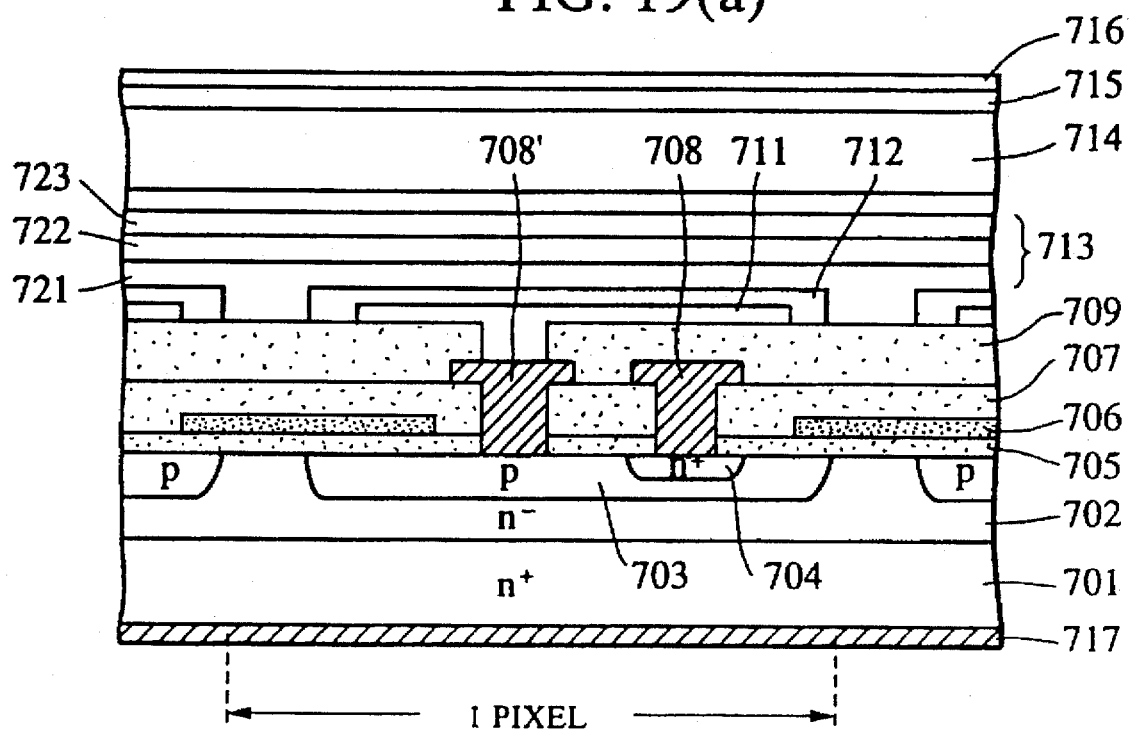
FIG. 19a shows its cross section and FIG. 19b is an equivalent circuit of the device.
Figure 19B:
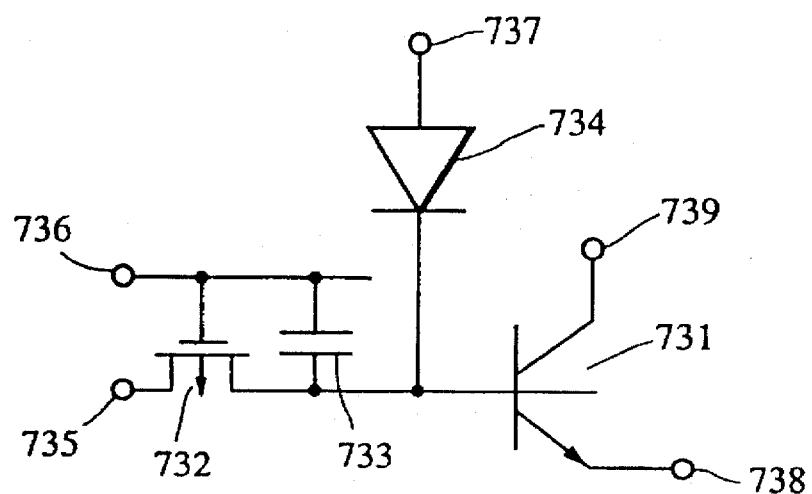
Figure 20:
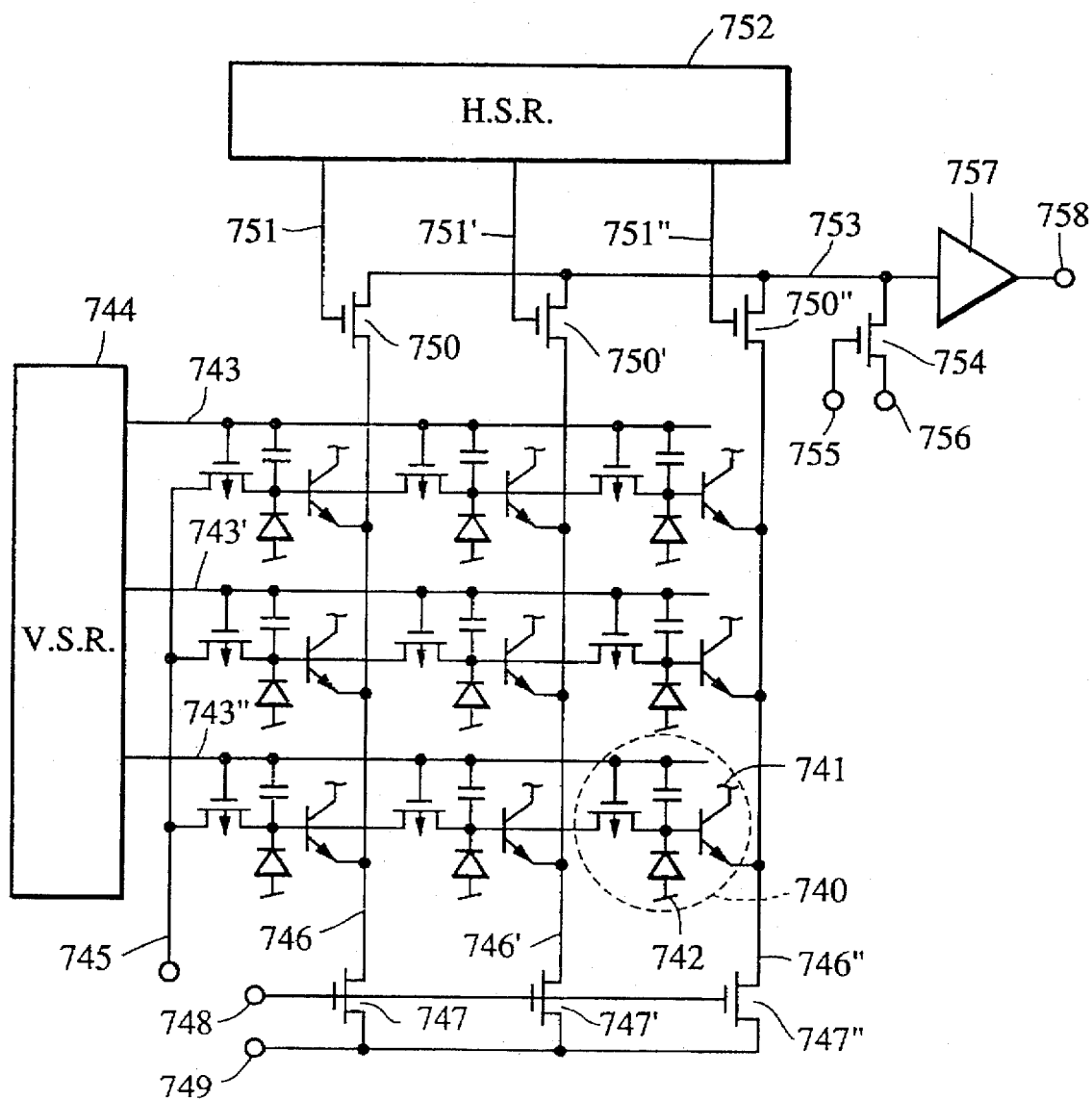
FIG. 20 is an equivalent circuit of an information processing device embodying the present invention.

FIG. 19a is a cross-sectional view schematically showing a photo sensing element according to this embodiment and a portion around it. FIG. 19b shows an equivalent circuit of one pixel. FIG. 20 shows an equivalent circuit partially including block representations of the entire device.

Referring to FIG. 19a, there are shown an n⁻-type layer 702 acting as a collector region formed on an n-type silicon substrate 701 by means of epitaxial growth; a p-base region 703 formed in the n⁻-type layer 702; an n⁺-emitter region 704 formed in the base region 703 so as to form a bipolar transistor. The p-base region 703 is isolated from adjacent pixels. A gate electrode 706 is disposed on an oxide layer 705 between the p-base regions which are adjacent to each other in a horizontal direction. As a result, there is formed a p-channel MOS transistor in which the above-described adjacent p-regions 703 act as a source and drain electrode, respectively. The gate electrode 706 also acts as a capacitor electrode to control the potential of the p-base region 703. After an insulating layer 707 is formed, an emitter electrode 708 and a base electrode 708' are formed. Then, an insulating layer 709 and subsequently an electrode 711 are formed so as to isolate each pixel. The electrode 711 is electrically connected to the electrode 708'. Then, bandgap-grading layers having a gradient of composition ratio from $a\text{-}Si_{1-y}Ge_y\text{:}H$ to $a\text{-}Si_{1-x}C_x\text{:}H$ are produced so as to form multiplication layers 713. Furthermore, a light absorption layer 714 composed of a-Si:H is formed. Subsequently, a p-type $a\text{-}Si_{1-x}C_x\text{:}H$ layer 715 and a transparent electrode 716 used to apply a bias voltage are formed. A collector electrode 717 is also formed on the back surface of the substrate 701 so that the electrode 717 may be in ohmic contact with the substrate 701.

Thus, as shown in FIG. 19b, the equivalent circuit of one pixel comprises a bipolar transistor 731 composed of silicon crystal; a p-channel MOS transistor 732; a capacitor 733; and a photoelectrical conversion device 734 similar to that described in the previous embodiment; wherein the base of the bipolar transistor 731 is connected to the p-channel MOS transistor 732, the capacitor 733, and the photoelectrical conversion device 734; and the equivalent circuit further comprises a terminal 735 for applying potential to the base; a terminal 736 for driving the p-channel MOS transistor 732 and the capacitor; an electrode 737 for applying potential to the transparent electrode; an emitter electrode 738; and a collector electrode 739.

FIG. 20 is a circuit diagram of a circuit comprising a 3×3 two-dimensional array in which each element is composed of a pixel cell 740 shown in FIGS. 19a and 19b. In FIG. 20, a collector electrode 741 and a sensor electrode 742 shown in one pixel cell 740 are also provided in each of the other pixels. The gate electrodes of PMOS transistors and the electrodes of capacitors which are included in each of rows are connected all together and are coupled to a vertical shift register (VSR) 744 via corresponding driving interconnection lines 743, 743' and 743", respectively. The emitter electrodes included in each column are connected to corresponding read-out vertical interconnection lines 746, 746' and 746", respectively. The vertical interconnection lines 746, 746' and 746" are connected to switches 747, 747', and 747", respectively, which are used to reset the charges associated with these vertical interconnection lines, and are also connected to read-out switches 750, 750', and 750", respectively. The gate electrodes of the reset switches 747, 747', and 747" are connected in common to a terminal 748 to which a vertical line reset pulse is applied. The source electrodes of the reset switches 747, 747', and 747" are connected in common to a terminal 749 through which a vertical line reset voltage is supplied. Each of the gate electrodes of read-out switches 750, 750' and 750" is connected to a horizontal shift register (HSR) 752 through interconnections 751, 751', and 751", respectively. The drain electrodes of read-out switches 750, 750'and 750" is connected to an output amplifier 757 through a horizontal read-out incterconneccction line 753. The horizontal read-out interconnection line 753 is connected to a switch 754 which is used to reset the charge associated with the horizontal read-out interconnection line. The reset switch 754 is connected to a terminal 755 to which a horizontal interconnection line reset pulse is applied, and the reset switch 754 is also connected to a terminal 756 through which a horizontal interconnection line voltage is supplied. The output of the amplifier 757 is supplied to the external via a terminal 758.

Referring to FIGS. 19a and 19b and also to FIG. 20, the operation of the device will be described briefly below. The light absorption layer 714 shown in FIG. 19a absorbs incident light and, as a result, carriers are generated. The generated carriers are multiplied in the multiplication layers 713 and the carriers are accumulated in the base region 703. When a driving pulse, which is supplied by the vertical shift register shown in FIG. 20, appears on the driving line 743, the potential of the base is raised via the capacitor, and thus the signal charges corresponding to the amount of light are output from each pixel in the first row via the vertical interconnection lines 746, 746', and 746". After that, the horizontal shift register 752 provides scanning pulses sequentially over the lines 751, 751', and 751", then the switches 750, 750', and 750" are sequentially turned on and off so that signals are output via the amplifier 757 and via the output terminal 758. In the operation, the reset switch 754 is turned on during the interval between a time when a certain switch of 750, 750', and 750" is turned off and a time when the next switch is turned on, so that residual charges associated with the horizontal interconnection line 753 may be removed. Then, the vertical interconnection line reset switches 747, 747', and 747" are turned on and the residual charges associated with the vertical interconnection lines 746, 746', and 746" are removed. When a negative going pulse is applied by the vertical shift register 744 to the driving line 743, each PMOS transistor in the first row is turned on and the residual charges associated with the bases of respective pixels are removed or reset. Then, a driving pulse provided by the vertical shift register 744 appears on the driving line 743', and signal charges are output from each pixel in the second row in the same manner as in the first row. Similarly, the signal charges will be output from each pixel in the third and the following lines. The operation described above will be repeated.

In this embodiment described above, the photoelectrical conversion device according to the present invention is applied to a circuit which has been invented by the inventors of the present invention. However, the device may also be applied to another type of photoelectrical conversion circuit.

As described above, the present invention provides a heterojuntion composed of non-single crystal silicon carbide having an optical energy bandgap larger than 2.8 eV and single crystal silicon or non-single crystal silicon-germanium, wherein the valence band discontinuity arising from the difference in optical energy bandgap is made less than 0.3 eV. A thin film semiconductor device such as a photoelectrical conversion device including a heterojunction formed according to the present invention does not suffer from degradation in hole mobility as opposed to conventional devices. Thus, it becomes possible to drastically improve the performance of semiconductor devices.

A solar cell having a window layer formed according to the present invention can absorb higher energy components of sunlight, and thus can generate a larger number of photo carriers without use of a buffer layer at an interface. Because no degradation in hole transport performance occurs, a higher fill factor (FF) and also drastic improvement in performance can be achieved.

A thin film transistor or a photosensor having a superlattice structure acting as a barrier layer or as a light absorption layer composed of a plurality of a semiconductor layers formed according to the present invention exhibits a high electron mobility without degradation in hole mobility, and thus can operate at a high speed.

A multi-layer structure according to the present invention may also be advantageously applied to a thin film light emitting device such as an EL or LED in which light emission due to recombination can occur in the entire region of light emitting layers.

Non-single crystal silicon carbide according to the present invention may also be used to form a light absorption layer and carrier multiplication layers composed of a plurality of non-single crystal layers each of which has a gradient in optical energy bandgap for use in an APD-type photoelectrical conversion device. The device exhibits a high multiplication factor even under a low bias voltage condition and can operate at a high speed. Moreover, from a viewpoint of industrial production, there is an advantage that the device can be easily produced with less danger. Because the film of the present invention can be formed at a low temperature, the film can be formed on any substrate, and thus it is possible to form the film on a semiconductor substrate on which signal processing circuits or the like have been already formed so as to obtain a complex photoelectrical conversion device or an information processing device.

More specifically, the advantages are as follows:

(1) In accordance to the present invention, a light absorption layer or multiplication layer in a photoelectrical conversion device can be made of non-single crystal materials which are not very toxic. As a result, a device may be produced at a low cost, which is a great advantage from a viewpoint of industrial production.

(2) A non-single crystal material for use in a photoelectrical conversion device can be formed by means of plasma-CVD, sputtering, or the like. Therefore, a film may be formed on a large area at a low temperature (100°–300° C.). As a result, the present invention may be applied to a large size of photoelectrical conversion device. It is also possible to form a film on a semiconductor substrate on which a signal processing circuit or the like has been already formed, and thus the present invention may have a wide variety of applications.

(3) A non-single crystal material such as $a\text{-}Si_{1-y}Ge_y\text{:}H$ and $a\text{-}Si\text{:}H$ formed in accordance with the present invention has a large minimum energy bandgap (1.1–1.7 eV). In conjunction with $a\text{-}Si_{1-x}C_x\text{:}H$, it is possible to form a stepping back heterojuntion having a large discontinuity $\Delta Ec$ only in the conduction band. A multiplication layer with such a heterostructure exhibits not only low excess noise but also low dark current noise, that is, low noise and high multiplication operation can be achieved.

(4) Even if the electric field appearing across the multiplication layer becomes low as carriers are accumulated, neither spikes nor notches will appear in the stepping back heterojunction region of the multiplication layer. As a result, the band discontinuity at the stepping back heterointerface is maintained even in a low electric field region, and thus it is possible to achieve a high ionization rate similar to that obtained under a high electric field condition. Furthermore, there is no discontinuity in the direction of carrier transport at an interface between $a\text{-}Si_{1-x}C_x\text{:}H$ and $a\text{-}Si_{1-y}Ge_y\text{:}H$ or $a\text{-}Si\text{:}H$ and thus no degradation occurs in carrier transport. As a result, it is possible to achieve a high multiplication factor and good linearity between the amount of incident light and output. High speed carrier accumulation can also be achieved.

While the present invention has been described with reference to specific embodiments, the description is illustrative of the invention and is not to be construed as limiting the invention. Various modifications and/or combinations may occur to those skilled in the art without departing from the true spirit and scope of the invention as defined by the appended claims.

What is claimed is:

1. A thin film semiconductor device comprising at least one thin semiconductor layer which forms a heterojunction with a non-single crystal silicon layer or non-single crystal silicon-germanium layer, wherein the valence band discontinuity arising from the difference in optical energy bandgap at the heterointerface between said thin semiconductor layer and said non-single crystal silicon layer or said non-single crystal silicon-germanium layer is less than 0.3 eV, wherein said thin semiconductor layer is a non-single crystal silicon carbide layer including hydrogen atoms, said non-single crystal silicon carbide layer having a value x greater than 0.45 where said non-single crystal silicon carbide layer is described as $Si_{1-x}C_x$:H and the number of hydrogen atoms bonded with carbon atoms in said non-single crystal silicon carbide layer is at least five times the number of hydrogen atoms bonded with silicon atoms, and wherein said thin semiconductor layer has an optical energy bandgap greater than 2.8 eV and the conduction bandgap discontinuity arising from the difference in optical energy bandgap is greater than 1.0 eV.

2. A thin film semiconductor device according to claim 1, wherein said thin semiconductor layer is formed on a side of said device on which light is incident.

3. A thin film semiconductor device according to claim 1, including a semiconductor region having a multi-layer structure composed of a plurality of layers consisting of said thin semiconductor layer which forms a heterojunction with said non-single crystal silicon layer or said non-single crystal silicon-germanium layer.

4. A thin film semiconductor device according to claim 3, wherein said semiconductor region is a light emitting region.

5. A thin film semiconductor device according to claim 1, wherein said thin film semiconductor device is a photoelectric conversion device utilizing avalanche effects.

6. A thin film semiconductor device according to claim 5, wherein said photoelectric conversion device includes at least a light absorption layer and a carrier multiplication layer for multiplying carriers generated in said light absorption layer.

7. A thin film semiconductor device according to claim 6, wherein said carrier multiplication layer includes at least one semiconductor layer having a gradient in optical energy bandgap such that the optical energy bandgap of said semiconductor layer changes continuously from a minimum optical energy bandgap to a maximum optical energy bandgap, said semiconductor layer forming a stepping back structure having an abrupt energy band discontinuity at the heterointerface region between a wide optical energy bandgap region and a narrow optical energy bandgap region, carrier multiplication occurring in said heterointerface region.

8. A thin film semiconductor device according to claim 7, wherein said heterointerface region, in which carrier multiplication occurs, of said carrier multiplication layer has the minimum energy bandgap in the range from 1.4 eV to 1.7 eV.

9. A thin film semiconductor device according to claim 1, wherein said non-single crystal silicon layer includes amorphous silicon.

10. A thin film semiconductor device according to claim 1, wherein said non-single crystal silicon-germanium layer includes amorphous silicon-germanium.

11. A thin film semiconductor device according to claim 1, wherein said non-single crystal silicon carbide layer includes amorphous silicon carbide.

12. A thin film semiconductor device having a multi-layer semiconductor region and an insulating layer, comprising:

a plurality of non-single crystal silicon layers or a plurality of non-single crystal silicon-germanium layers; and a plurality of thin semiconductor layers which are disposed between said plurality of non-single crystal silicon layers or of non-single crystal silicon-germanium layers in such a manner that said plurality of thin semiconductor layers form heterojunctions;

wherein the valence band discontinuity arising from the difference in optical energy bandgap at said heterojunction between said thin semiconductor layer and said non-single crystal silicon layer or said non-crystal silicon-germanium layer is less than 0.3 eV, wherein said thin semiconductor is a non-crystal silicon carbide layer including hydrogen atoms, said non-single crystal carbide layer having a value x greater than 0.45 where said non-single crystal silicon carbide layer is described as $Si_{1-x}C_x$:H and the number of hydrogen atoms bonded with carbon atoms in said non-single crystal silicon carbide layer is at least five times the number of hydrogen atoms bonded with silicon atoms, and wherein said thin semiconductor layer has an optical energy bandgap greater than 2.8 eV and the conduction bandgap discontinuity arising from the difference in optical energy bandgap is greater than 1.0 eV.

13. A thin film semiconductor device according to claim 12, wherein said non-single crystal silicon layer includes amorphous silicon.

14. A thin film semiconductor device according to claim 12, wherein said non-single crystal silicon-germanium layer includes amorphous silicon-germanium.

15. A thin film semiconductor device according to claim 12, wherein said non-single crystal silicon layer includes amorphous silicon carbide.

16. An information processing device comprising:

a thin film semiconductor device comprising at least one thin semiconductor layer which forms a heterojunction with a non-single crystal silicon layer or non-single crystal silicon-germanium layer, wherein the valence band discontinuity arising from the difference in optical energy bandgap at the heterointerface between said thin semiconductor layer and said non-single crystal silicon layer or said non-single crystal silicon-germanium layer is less than 0.3 eV, wherein said thin semiconductor layer is a non-single crystal silicon carbide layer including hydrogen atoms, said non-single crystal silicon carbide layer having a value x greater than 0.45 where said non-single crystal silicon carbide layer is described as $Si_{1-x}C_x$:H and the number of hydrogen atoms bonded with carbon atoms in said non-single crystal silicon carbide layer is at least five times the number of hydrogen atoms bonded with silicon atoms, and wherein said thin semiconductor layer has an optical energy bandgap greater than 2.8 eV and the conduction bandgap discontinuity arising from the difference in optical energy bandgap is greater than 1.0 eV; and a signal output device, said thin film semiconductor device being formed on said signal output device or said thin film semiconductor device being electrically connected to said signal output device, said signal output device comprising at least one of means including (i) storage means for storing an electrical signal generated by said thin film semiconductor device, (ii) scanning means for scanning said electrical signal, and (iii) read-out means for reading out said electrical signal.

17. An information processing device according to claim 16, wherein said non-single crystal silicon layer includes amorphous silicon.

18. An information processing device according to claim 16, wherein said non-single crystal silicon-germanium layer includes an amorphous silicon-germanium layer.

19. An information processing device according to claim 16, wherein said thin semiconductor layer is formed on a side of said device on which light is incident.

20. An information processing device according to claim 16, wherein said non-single crystal silicon carbide layer includes amorphous silicon carbide.

21. An information processing device according to claim 16, wherein said thin film semiconductor device is a photoelectric conversion device utilizing avalanche effects.

22. An information processing device according to claim 21, wherein said photoelectric conversion device includes at least a light absorption layer and a carrier multiplication layer for multiplying carriers generated in said light absorption layer.

23. An information processing device according to claim 22, wherein said carrier multiplication layer includes at least one semiconductor layer having a gradient in optical energy bandgap such that the optical energy bandgap of said semiconductor layer changes continuously from a minimum optical energy bandgap to a maximum optical energy bandgap, said semiconductor layer forming a stepping back structure having an abrupt energy band discontinuity at the heterointerface region between a wide optical energy bandgap region and a narrow optical energy bandgap region, carrier multiplication occurring in said heterointerface region.

24. An information processing device according to claim 23, wherein said heterointerface region, in which carrier multiplication occurs, of said carrier multiplication layer has the minimum energy bandgap in the range from 1.4 eV to 1.7 eV.

* * * * *

UNITED STATES PATENT AND TRADEMARK OFFICE
CERTIFICATE OF CORRECTION

PATENT NO. : 5,686,734

DATED : November 11, 1997

INVENTOR(S): YOSHIHIRO HAMAKAWA ET AL.

It is certified that error appears in the above-identified patent and that said Letters Patent is hereby corrected as shown below:

COLUMN 2

Line 31, "in" should read --in the--;
Line 52, "non-single" should read --a non-single--;
Line 55, "non-single" should read --a non-single--;
Line 62, "ionization" should read --the ionization--.

COLUMN 3

Line 63, "forms" should read --forms an--.

COLUMN 5

Line 64, "of" should read --of an--.

COLUMN 6

Line 4, "which" should read --which a--.

COLUMN 8

Line 29, "makes" should read --makes it--;

COLUMN 9

Line 38, "the" should read --a--.

UNITED STATES PATENT AND TRADEMARK OFFICE
CERTIFICATE OF CORRECTION

PATENT NO. : 5,686,734

DATED : November 11, 1997

INVENTOR(S): YOSHIHIRO HAMAKAWA ET AL.

It is certified that error appears in the above-identified patent and that said Letters Patent is hereby corrected as shown below:

<u>COLUMN 10</u>

Line 16, "includes" should read --includes a--;
Line 18, "and" should read --and a--;
Line 28, "as" should read --as the--;
Line 30, "an enough" should read --a sufficient--;
Line 36, "If" should read --If the--.
Line 50, "maintaining" should read --while maintaining--;
Line 63, "depositon" should read --deposition--.

<u>COLUMN 11</u>

Line 3, "of" should read --of the--;
Line 13, "fist" should read --first--;
Line 17, "in" should be deleted.

<u>COLUMN 12</u>

Line 2, "power" should read --power is--;
Line 11, "that" should read --that the--.

<u>COLUMN 13</u>

Line 29, "a" (first occurrence) should read --it--.

UNITED STATES PATENT AND TRADEMARK OFFICE
CERTIFICATE OF CORRECTION

PATENT NO. : 5,686,734

DATED : November 11, 1997

INVENTOR(S): YOSHIHIRO HAMAKAWA ET AL.

Page 3 of 4

It is certified that error appears in the above-identified patent and that said Letters Patent is hereby corrected as shown below:

COLUMN 14

Line 3, "equal of" should be deleted;
Line 25, "of" should read --of the--;

COLUMN 15

Line 39, "of" should be deleted;
Line 56,

COLUMN 16

Line 8, "Therefor" should read --Therefore--.

COLUMN 18

Line 23, "of" (second occurrence) should read --of the--.

UNITED STATES PATENT AND TRADEMARK OFFICE
CERTIFICATE OF CORRECTION

PATENT NO. : 5,686,734

DATED : November 11, 1997

INVENTOR(S): YOSHIHIRO HAMAKAWA ET AL.

It is certified that error appears in the above-identified patent and that said Letters Patent is hereby corrected as shown below:

<u>COLUMN 20</u>

Line 7, "to" should read --with--.

Signed and Sealed this

Seventh Day of July, 1998

Attest:

BRUCE LEHMAN

*Attesting Officer*   *Commissioner of Patents and Trademarks*